(12) United States Patent
Akimoto et al.

(10) Patent No.: US 10,353,501 B2
(45) Date of Patent: Jul. 16, 2019

(54) DISPLAY DEVICE

(71) Applicant: Japan Display Inc., Tokyo (JP)

(72) Inventors: Hajime Akimoto, Tokyo (JP); Mitsuhide Miyamoto, Tokyo (JP); Yuko Matsumoto, Tokyo (JP); Yusuke Tada, Tokyo (JP)

(73) Assignee: Japan Display Inc., Tokyo (JP)

( * ) Notice: Subject to any disclaimer, the term of this patent is extended or adjusted under 35 U.S.C. 154(b) by 80 days.

(21) Appl. No.: 15/646,249

(22) Filed: Jul. 11, 2017

(65) Prior Publication Data

US 2018/0039360 A1 Feb. 8, 2018

(30) Foreign Application Priority Data

Aug. 3, 2016 (JP) .................................. 2016-152757

(51) Int. Cl.
*G09G 3/3225* (2016.01)
*G06F 3/041* (2006.01)
(Continued)

(52) U.S. Cl.
CPC ............ *G06F 3/0412* (2013.01); *G06F 3/044* (2013.01); *H01L 27/323* (2013.01);
(Continued)

(58) Field of Classification Search
None
See application file for complete search history.

(56) References Cited

U.S. PATENT DOCUMENTS 9,660,003 B2 5/2017 Sato et al.
2014/0321074 A1* 10/2014 Chida ................... H05K 7/14
361/749

(Continued)

FOREIGN PATENT DOCUMENTS

JP 2011-23558 A 2/2011
JP 2015-50245 A 3/2015

(Continued)

OTHER PUBLICATIONS

Korean Office Action dated Dec. 17, 2018 for the corresponding Korean patent application No. 10-2017-0081723, with machine translation.

*Primary Examiner* — Jennifer Mehmood
*Assistant Examiner* — Parul H Gupta
(74) *Attorney, Agent, or Firm* — Michael Best & Friedrich LLP

(57) ABSTRACT

Disclosed is a display device having a first layer and a second layer over the second layer. The first layer possesses a display region including: a plurality of first sub-pixels; a plurality of second sub-pixels; a plurality of third sub-pixels; a partition wall sandwiched by two adjacent sub-pixels; and a sealing film thereover. The second layer includes: a first touch electrode overlapping with the partition wall and arranged along the partition wall; and a second touch electrode overlapping with the partition wall, arranged along the partition wall, and intersecting the first touch electrode. The first touch electrode and the second touch electrode exist in the same layer. The first touch electrode and the second touch electrode each have a plurality of openings. Among the number of the first sub-pixels, the number of the second sub-pixels, and the number of the third sub-pixels, one is different from the other two.

15 Claims, 25 Drawing Sheets

(51) Int. Cl.
  *H01L 27/32*       (2006.01)
  *H01L 51/52*       (2006.01)
  *G06F 3/044*       (2006.01)

(52) U.S. Cl.
  CPC ...... *H01L 27/3276* (2013.01); *H01L 51/5218* (2013.01); *H01L 51/5275* (2013.01); *H01L 51/5281* (2013.01); *G06F 2203/04111* (2013.01); *G06F 2203/04112* (2013.01); *G09G 3/3225* (2013.01); *G09G 2300/0452* (2013.01); *H01L 27/322* (2013.01); *H01L 27/3216* (2013.01); *H01L 2227/323* (2013.01); *H01L 2251/5315* (2013.01)

(56) References Cited

U.S. PATENT DOCUMENTS

| | | |
|---|---|---|
| 2015/0049030 A1 | 2/2015 | Her |
| 2015/0309644 A1 | 10/2015 | Sun et al. |
| 2016/0103516 A1 | 4/2016 | An |
| 2016/0154499 A1 | 6/2016 | Bae et al. |
| 2016/0282989 A1* | 9/2016 | Hirakata ................ G06F 3/044 |
| 2017/0147116 A1 | 5/2017 | Lee et al. |

FOREIGN PATENT DOCUMENTS

| | | |
|---|---|---|
| KR | 10-2015-0020929 A | 2/2015 |
| KR | 10-2016-0043577 A | 4/2016 |
| KR | 10-2016-0055013 A | 5/2016 |
| KR | 10-2016-0065396 A | 6/2016 |

* cited by examiner

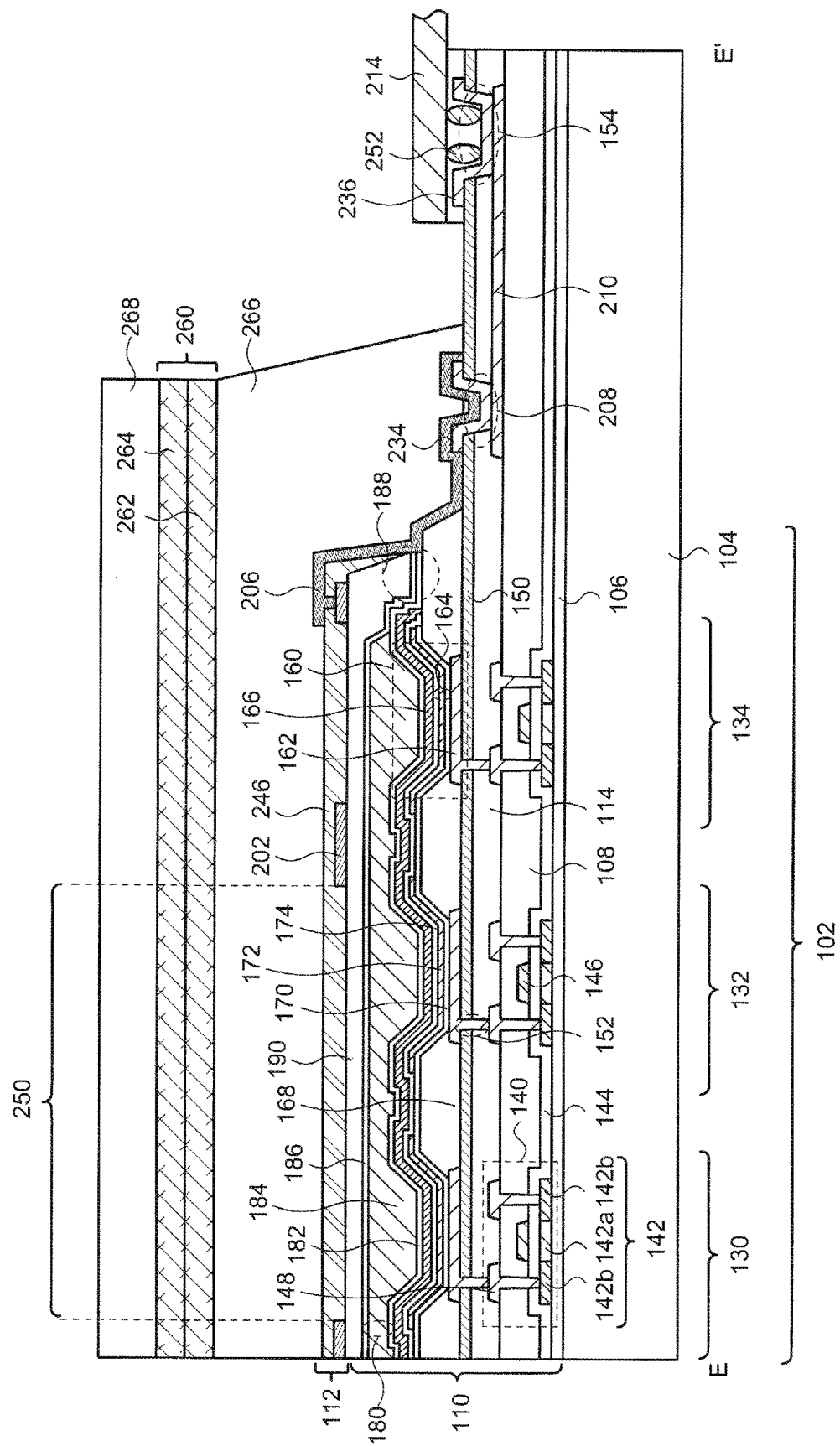

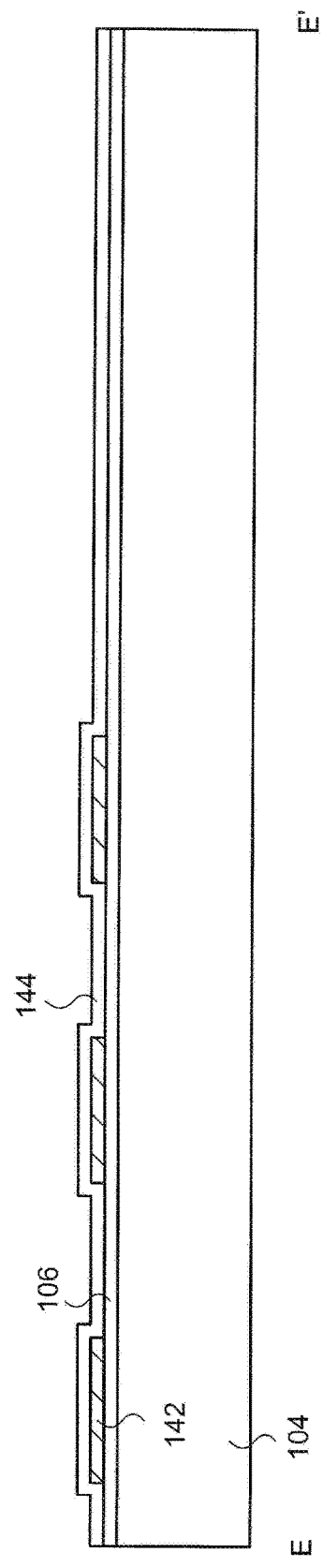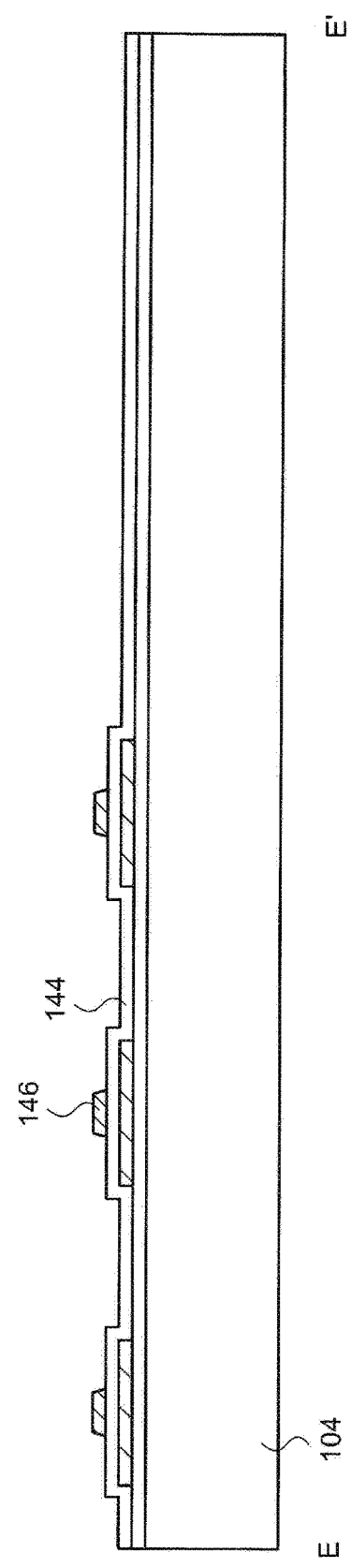

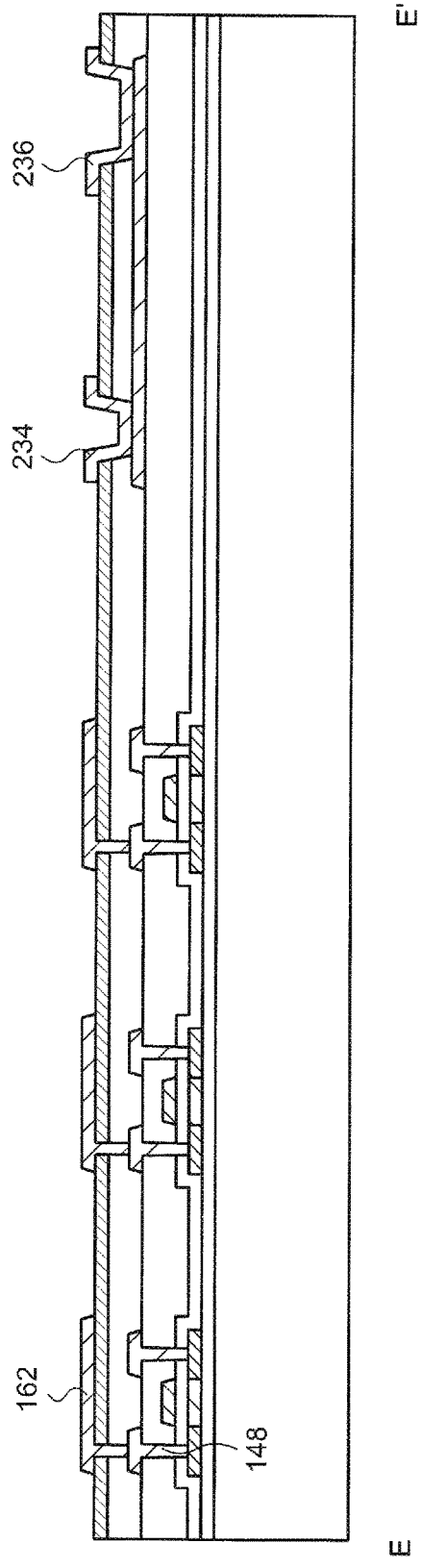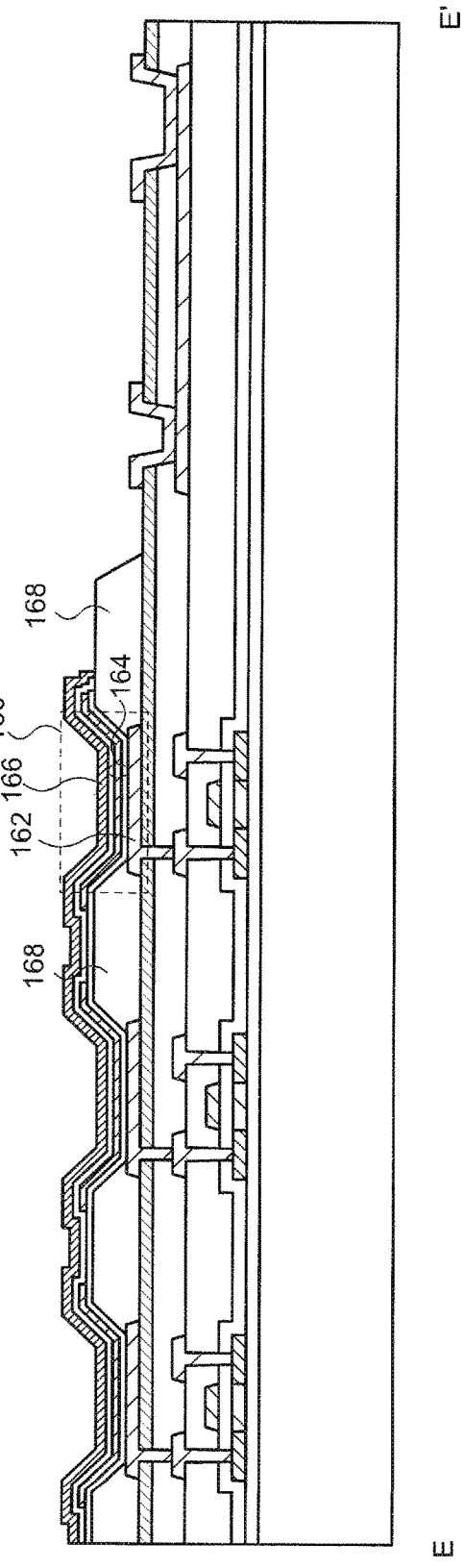

DISPLAY DEVICE

CROSS REFERENCE TO RELATED APPLICATIONS

This application is based on and claims the benefit of priority from the prior Japanese Patent Application No. 2016-152757, filed on Aug. 3, 2016, the entire contents of which are incorporated herein by reference.

FIELD

An embodiment of the present invention relates to a display device installed with a touch sensor. For example, an embodiment of the present invention relates to an organic EL (Electroluminescence) display device installed with a tough sensor.

BACKGROUND

A touch sensor has been known as an interface for a user to input information to a display device. Arrangement of a touch sensor so as to overlap with a screen of a display device allows a user to operate input buttons, icons, and the like displayed on a screen, by which information can be readily input to a display device. For example, Japanese patent application publications No. 2015-50245 and No. 2011-23558 disclose an electronic apparatus in which a touch sensor is mounted over an organic EL (Electroluminescence) display device.

SUMMARY

An embodiment of the present invention is a display device having a first layer and a second layer over the first layer. The first layer possesses a display region, and the display region includes: a plurality of first sub-pixels configured to emit first light; a plurality of second sub-pixels configured to emit second light; a plurality of third sub-pixels configured to emit third light; a partition wall sandwiched by two adjacent sub-pixels selected from the first sub-pixel, the second sub-pixel, and the third sub-pixel; and a sealing film over the first sub-pixels, the second sub-pixels, the third sub-pixels, and the partition wall. The second layer includes: a first touch electrode overlapping with the partition wall and arranged along the partition wall; and a second touch electrode overlapping with the partition wall, arranged along the partition wall, and intersecting the first touch electrode. The first light, the second light, and the third light are different in color from one another. The first touch electrode and the second touch electrode exist in the same layer. The first touch electrode and the second touch electrode each have a plurality of openings. Among one of the number of the first sub-pixels, the number of the second sub-pixels, and the number of the third sub-pixels, one is different from the other two.

An embodiment of the present invention is a display device having a first layer and a second layer over the first layer. The first layer possesses a display region, and the display region includes: a plurality of first sub-pixels configured to emit first light; a plurality of second sub-pixels configured to emit second light; a plurality of third sub-pixels configured to emit third light; a partition wall sandwiched by two adjacent sub-pixels selected from the first sub-pixel, the second sub-pixel, and the third sub-pixel; and a sealing film over the first sub-pixels, the second sub-pixels, the third sub-pixels, and the partition wall. The second layer includes: a first touch electrode overlapping with the partition wall and arranged along the partition wall; an interlayer insulating film over the first touch electrode; and a second touch electrode located over the interlayer insulating film, overlapping with the partition wall, arranged along the partition wall, and intersecting the first touch electrode. The first light, the second light, and the third light are different in color from one another. The first touch electrode and the second touch electrode each have a plurality of openings. Among one of the number of the first sub-pixels, the number of the second sub-pixels, and the number of the third sub-pixels, one is different from the other two.

BRIEF DESCRIPTION OF DRAWINGS

FIG. 8 is a schematic cross-sectional view of a display device according to an embodiment of the present invention;

FIG. 15A and FIG. 15B are schematic cross-sectional views explaining a manufacturing method of a display device according to an embodiment of the present invention;

FIG. 18A and FIG. 18B are schematic cross-sectional views explaining a manufacturing method of a display device according to an embodiment of the present invention;

DESCRIPTION OF EMBODIMENTS

Hereinafter, the embodiments of the present invention are explained with reference to the drawings. The invention can be implemented in a variety of different modes within its concept and should not be interpreted only within the disclosure of the embodiments exemplified below.

The drawings may be illustrated so that the width, thickness, shape, and the like are illustrated more schematically compared with those of the actual modes in order to provide a clearer explanation. However, they are only an example, and do not limit the interpretation of the invention. In the specification and the drawings, the same reference number is provided to an element that is the same as that which appears in preceding drawings, and a detailed explanation may be omitted as appropriate.

In the present invention, when a plurality of films is formed by processing one film, the plurality of films may have functions or rules different from each other. However, the plurality of films originates from a film formed as the same layer in the same process and has the same layer structure and the same material. Therefore, the plurality of films is defined as films existing in the same layer.

In the specification and the scope of the claims, unless specifically stated, when a state is expressed where a structure is arranged "over" another structure, such an expression includes both a case where the substrate is arranged immediately above the "other structure" so as to be in contact with the "other structure" and a case where the structure is arranged over the "other structure" with an additional structure therebetween.

<First Embodiment>

1. Outline Structure

Figure 1A:
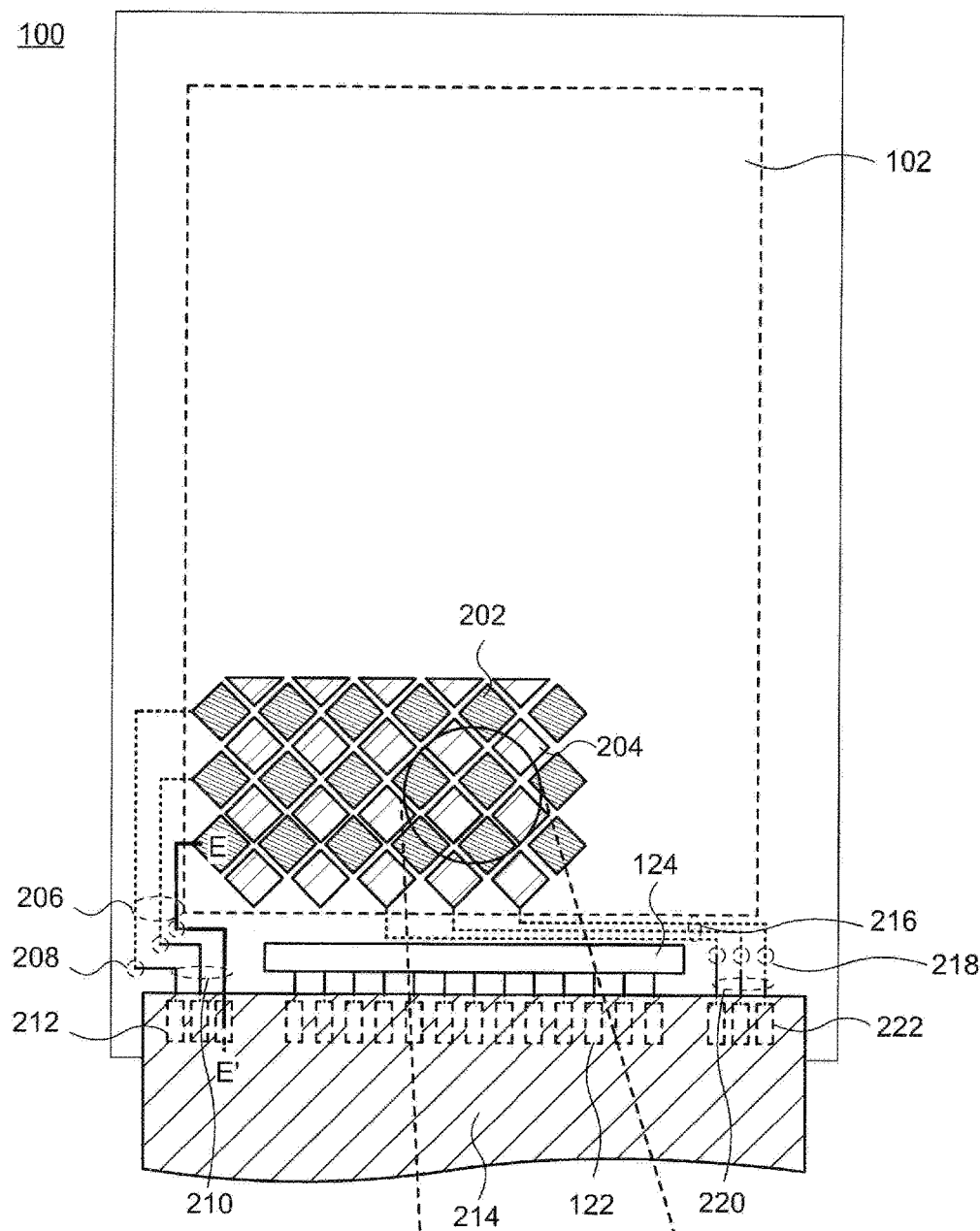
FIG. 1A and FIG. 1B are schematic top views of a display device according to an embodiment of the present invention.

FIG. 1A is a schematic top view of a display device 100 on which a touch sensor is mounted (hereinafter, simply referred to as a display device) according to a first embodiment of the present invention. The display device 100 has a display region 102 for displaying an image. A plurality of first touch electrodes 202 arranged in a stripe form in a row direction and a plurality of second touch electrodes 204 arranged in a stripe form in a column direction and intersecting the first touch electrodes 202 are provided so as to overlap with the display region 102. A touch sensor 200 is structured by the plurality of first touch electrodes 202 and the plurality of second touch electrodes 204. One of the first touch electrodes 202 and the second touch electrodes 204 is called a transmitting electrode (Tx), and the other is called a receiving electrode (Rx). The first touch electrodes 202 and the second touch electrodes 204 each are spaced from one another, and capacitance is formed therebetween. When a finger of a user and the like touches the display region 102 through the first touch electrodes 202 and the second touch electrodes 204 (hereinafter, this operation is called a touch), the capacitance is changed, and sensing of this change enables determination of a position of the touch. Thus, a so-called projective capacitive touch sensor 200 is fabricated by the first touch electrodes 202 and the second touch electrodes 204.

The first touch electrodes 202 are electrically connected to first wirings 206 extending from the outside of the display region 102. The first wirings 206 extend outside the display region 102 and are electrically connected to first terminal wirings 210 in contact holes 208. The first terminal wirings 210 are exposed at a vicinity of an edge portion of the display device 100 to form first terminals 212. The first terminals 212 are connected to a flexible printed circuit (FPC) 214, and signals for a touch sensor are provided to the first touch electrodes 202 from an external circuit (not illustrated) through the first terminals 212.

Similarly, the second touch electrodes 204 are electrically connected to second wirings 216 extending from the outside of the display region 102. The second wirings 216 extend outside the display region 102 and are electrically connected to second terminal wirings 220 in contact holes 218. The second terminal wirings 220 are exposed at the vicinity of the edge portion of the display device 100 to form second terminals 222. The second terminals 222 are connected to the FPC 214, and signals for a touch sensor is provided to the second touch electrodes 204 from the external circuit through the second terminals 222.

Third terminals 122 for supplying signals to pixels 120 in the display region 102 and an IC chip 124 for controlling operation of the pixels 120 are further illustrated in FIG. 1A. As shown in FIG. 1A, the first terminals 212, the second terminals 222, and the third terminals 122 can be formed so as to be arranged along a side of the display device 100, which allows the use of a single FPC 214 to supply signals to the display region 102 and the touch sensor 200.

Figure 2:
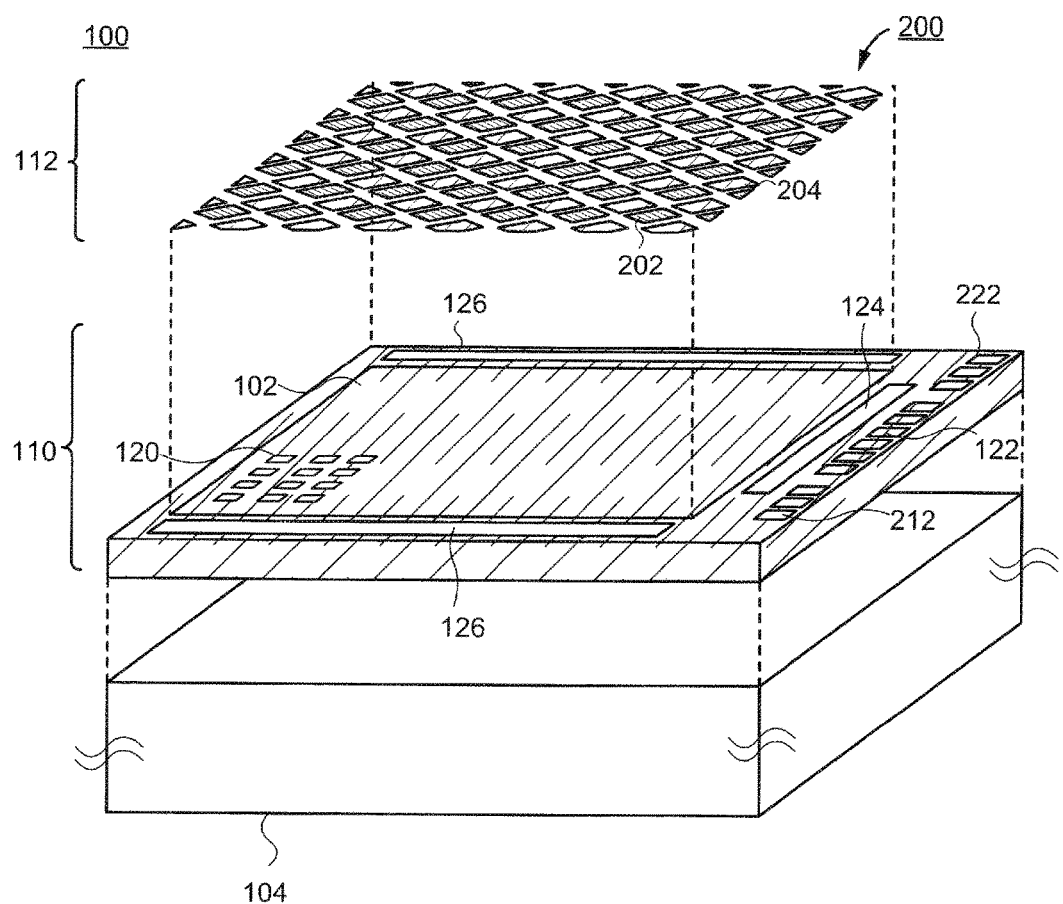
FIG. 2 is a schematic view showing a structure of a display device according to an embodiment of the present invention.

FIG. 2 shows a schematic perspective view of the display device 100. Here, a substrate 104, a first layer 110 including the display region 102, and a second layer 112 including the touch sensor 200 are separately illustrated in order to promote understanding.

The first layer 110 is provided over the substrate 104. The first layer 110 includes the display region 102, and the plurality of pixels 120 are disposed in the display region 102. Scanning-line driver circuits 126 for controlling operation of the pixels 120 are disposed outside the display region 102. The scanning-line driver circuits 126 may not be directly formed over the substrate 104, and a driver circuit fabricated over a substrate (e.g., a semiconductor substrate and so on) different from the substrate 104 may be arranged over the substrate 104 or the FPC 214 to control each pixel 120. Although not illustrated here, a variety of semiconductor elements are formed in the first layer 110 to control light-emitting elements disposed in the pixels 120.

As described above, the touch sensor 200 is configured by the plurality of first touch electrodes 202 and the plurality of second touch electrodes 204. The touch sensor 200 may have substantially the same size and shape as the display region 102.

2. Pixel

Figure 3A:
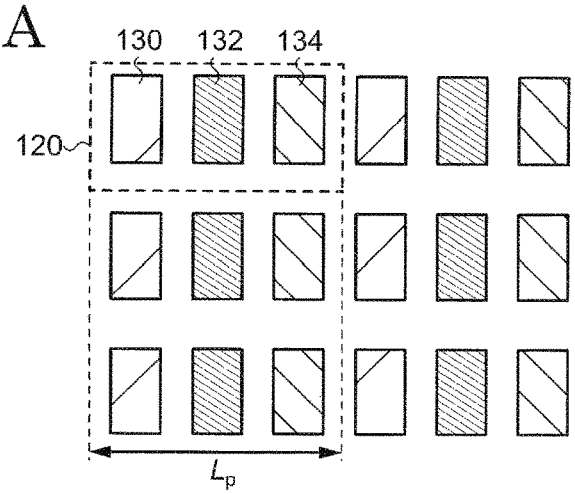
FIG. 3A to FIG. 3C are schematic views of a pixel of a display device according to an embodiment of the present invention.

In the present embodiment, the pixels 120 each have a plurality of sub-pixels. The sub-pixels are arranged so that one pixel 120 is constructed by three sub-pixels 130, 132, and 134 as shown in FIG. 3A, for example. A display element such as a light-emitting element or a liquid crystal element is provided in each sub-pixel. Colors provided by the sub-pixels are determined by the light-emitting element or a property of a color filter formed over the sub-pixels. In the present specification and claims, the pixel 120 is defined as the minimum unit which has a plurality of sub-pixels each having one display element, where at least one of the sub-pixels gives a different color, and which structures a part of an image produced on the display region 102. The sub-pixels in the display region 102 are each included in the respective pixel 120.

In the arrangement exemplified in FIG. 3A, three sub-pixels 130, 132, and 134 may be configured to provide colors different from one another. For example, light-emitting elements giving the three primary colors of red, green, and blue can be provided in the sub-pixels 130, 132, and 134, respectively, by which arbitrary color can be produced in each pixel 120.

Figure 3B:
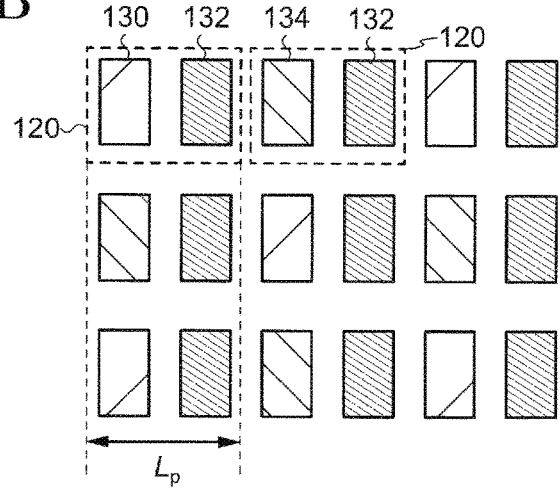

In the arrangement shown in FIG. 3B, two sub-pixels giving different colors are included in one pixel 120. For example, one pixel 120 may possess sub-pixels 130 and 132 respectively giving red and green colors, and sub-pixels 134 and 132 respectively giving blue and green colors may be arranged in the adjacent pixel 120. In this case, a reproduced color gamut is different between adjacent pixels 120.

Figure 3C:
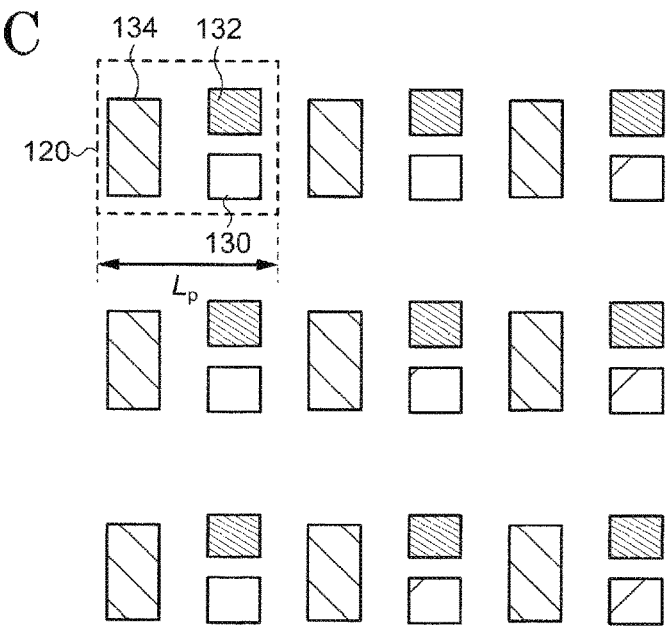

It is not necessary that an area of the sub-pixel is identical in each pixel 120. For example, as shown in FIG. 3C, one sub-pixel may have a different area from the other two sub-pixels. In this case, the sub-pixel 134 giving blue color may be formed to have the largest area, while the sub-pixels 132 and 130 respectively giving green and red colors may be formed to have the same area.

As shown in FIG. 3A to FIG. 3C, the pixels 120 may have a substantially square shape and be arranged in a matrix form so as to be in contact with one another. In the present specification and claims, when the pixels 120 other than the outermost pixels 120 are arranged so that four sides of the pixel 120 having a square shape are in contact with the adjacent pixels 120, a distance between opposing sides in each pixel 120 is defined as a length $L_p$ of a side of the pixel 120.

3. Touch Electrode

Figure 1B:
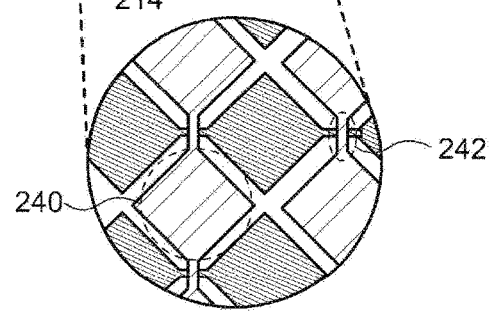

An aspect of an enlarged part of FIG. 1A is shown in FIG. 1B. As shown in FIG. 1B, the first touch electrodes 202 and the second touch electrodes 204 each possess a plurality of square regions (diamond electrode) 240 having a substantially square shape and a plurality of connection regions 242 alternating with each other. The first touch electrodes 202 are spaced and electrically independent from the second touch electrodes 204.

Figure 4A:
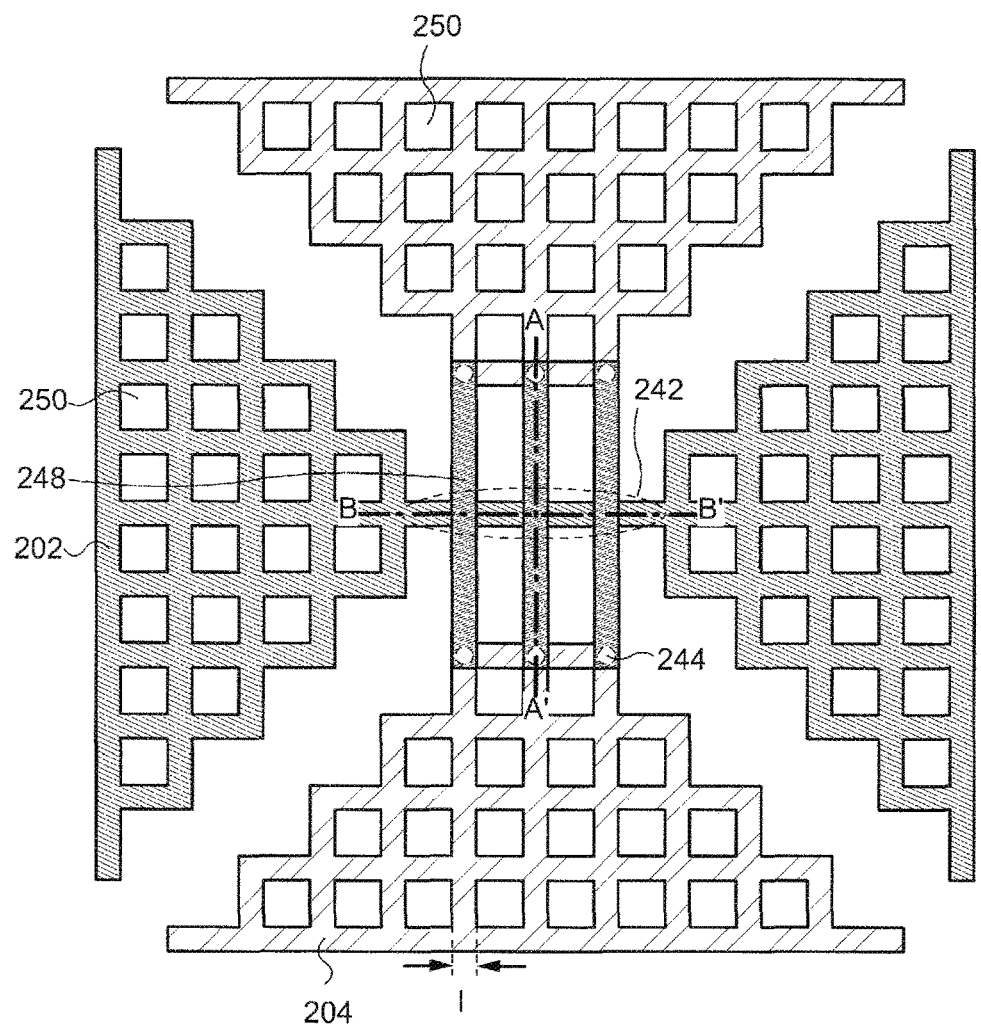
FIG. 4A and FIG. 4B are schematic top views of a touch electrode of a display device according to an embodiment of the present invention.

An enlarged top view of the first touch electrode 202 and the second touch electrode 204 is schematically illustrated in FIG. 4A. The first touch electrode 202 and the second touch electrode 204 both have a mesh form. That is, these electrodes are mesh wirings with a plurality of openings 250 arranged in a matrix form. A width of the wiring is 1 μm to 10 μm or 2 μm to 8 μm and typically 5 μm.

Figure 5A:
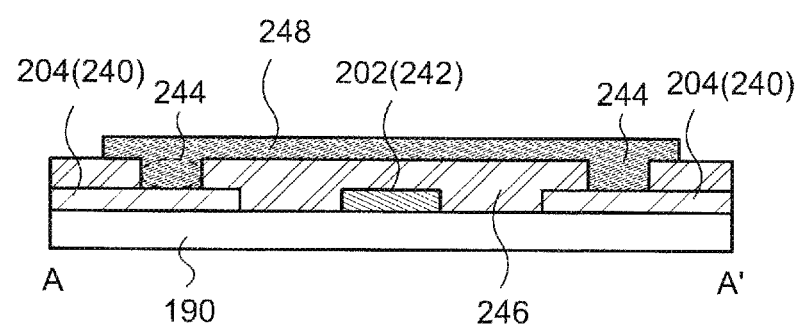
FIG. 5A and FIG. 5B are schematic cross-sectional views of a touch electrode of a display device according to an embodiment of the present invention.
Figure 5B:
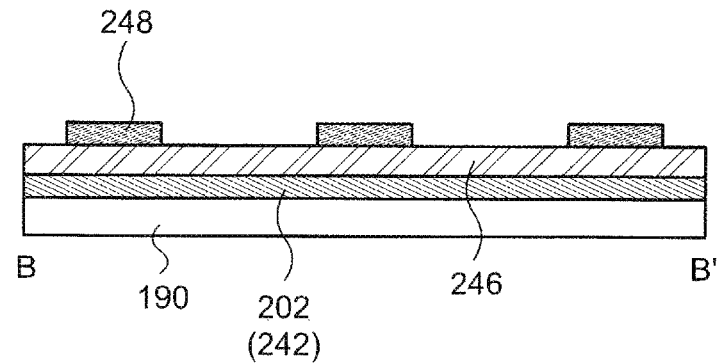

Cross sections along chain lines A-A' and B-B' of FIG. 4A are respectively illustrated in FIG. 5A and FIG. 5B. As shown in FIG. 5A and FIG. 5B, both of the diamond electrodes 240 and the connection regions 242 of the first touch electrode 202 and the second touch electrode 204 are provided over an organic insulating film 190 (described below). The first touch electrode 202 and the second touch electrode 204 may be in contact with the organic insulating film 190. Here, the first touch electrode 202 and the second touch electrode 204 may exist in the same layer. More specifically, the diamond electrodes 240 of the first touch electrode 202 and the second touch electrode 204 may exist in the same layer as each other. Formation of the first touch electrode 202 and the second touch electrode 204 in the same layer makes their optical properties such as a reflection property substantially the same as each other, which inhibits the first touch electrode 202 and the second touch electrode 204 from being readily detected visually, resulting in their inconspicuousness.

An interlayer insulating film 246 is provided over the first touch electrode 202, and a bridge wiring 248 is formed over the interlayer insulating film 246. The bridge wiring 248 is electrically connected to two adjacent diamond electrodes 248 of the second touch electrode 204 in openings 244 formed in the interlayer insulating film 246. Therefore, it is possible to recognize the bridge wiring 248 as the connection region 242 of the second touch electrode 204. The interlayer insulating film 246 also functions to electrically insulate the first touch electrode 202 from the second touch electrode 204 and serves as a dielectric to form capacitance between the first touch electrode 202 and the second touch electrode 204.

Figure 4B:
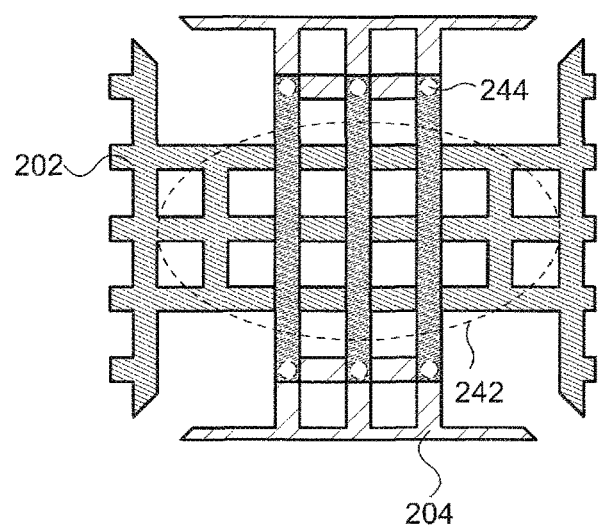

An example is shown in FIG. 4A, FIG. 5A, and FIG. 5B in which the bridge wiring 248 is formed over the first touch electrode 202 to electrically connect the diamond electrodes 240 of the second touch electrode 204. The bridge wiring 248 may be formed over the second touch electrode 204 to electrically connect the diamond electrodes 240 of the first touch electrode 202. The connection region 242 between the adjacent diamond electrodes 240 of the first touch electrode 202 is a single wiring in the example shown in FIG. 4A. However, this connection region 242 may include a plurality of wirings (FIG. 4B).

Figure 6:
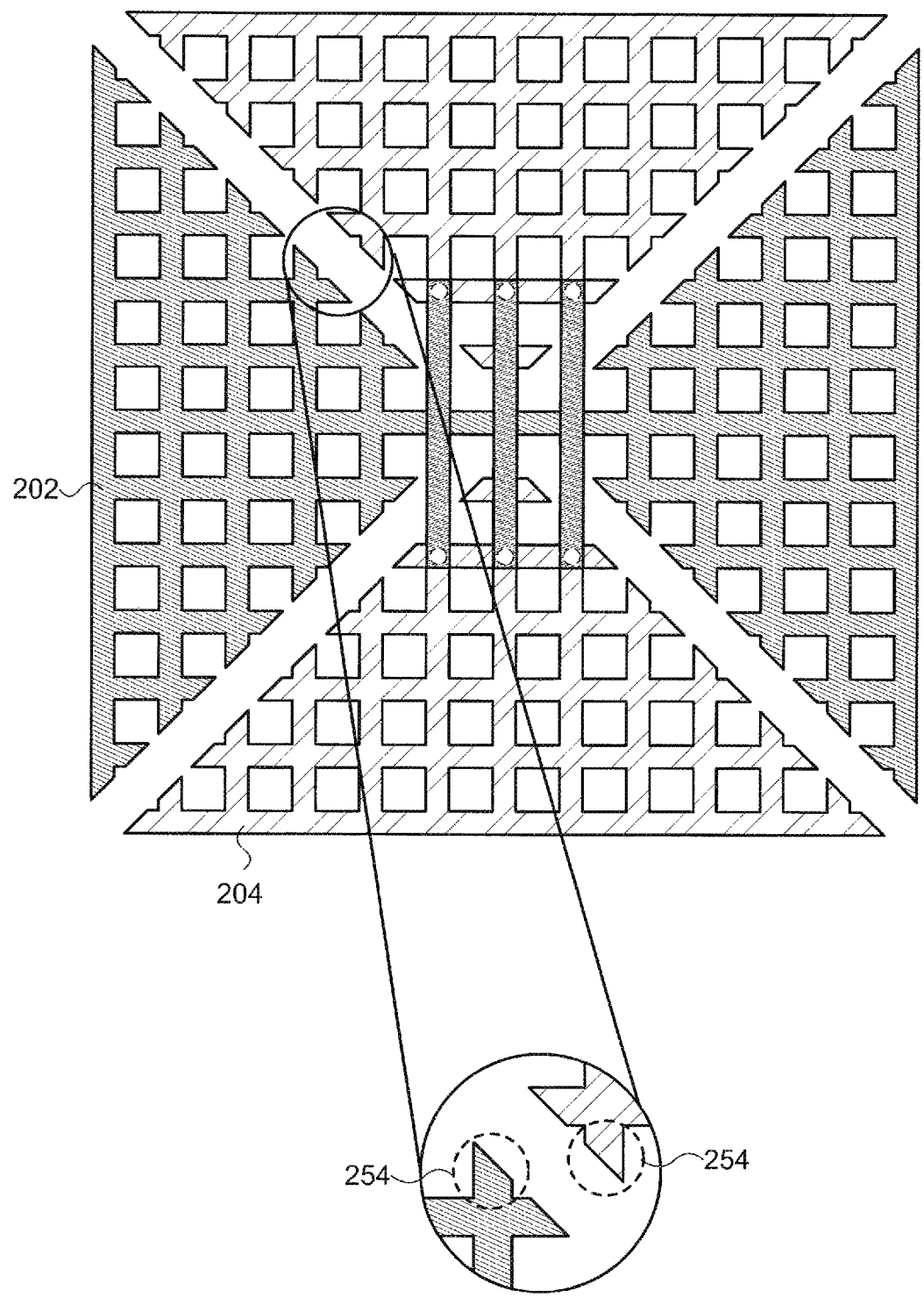
FIG. 6 is a schematic top view of a touch electrode of a display device according to an embodiment of the present invention.

Each of the diamond electrodes 240 of the first touch electrode 202 and the second touch electrode 204 may have a protruding portion 254 at an edge portion as shown in FIG. 6. This protruding portion 254 is not included in the openings 250 of the diamond electrode 240 and is a wiring which does not contribute to the formation of the openings 250. The formation of the protruding portion 254 enables reduction of a region where the mesh wiring is not formed between the first touch electrode 202 and the second touch electrode 204, resulting in an effect that the first touch electrodes 202 and the second touch electrodes 204 are not readily recognized on the display region 102 by a user.

Figure 23:
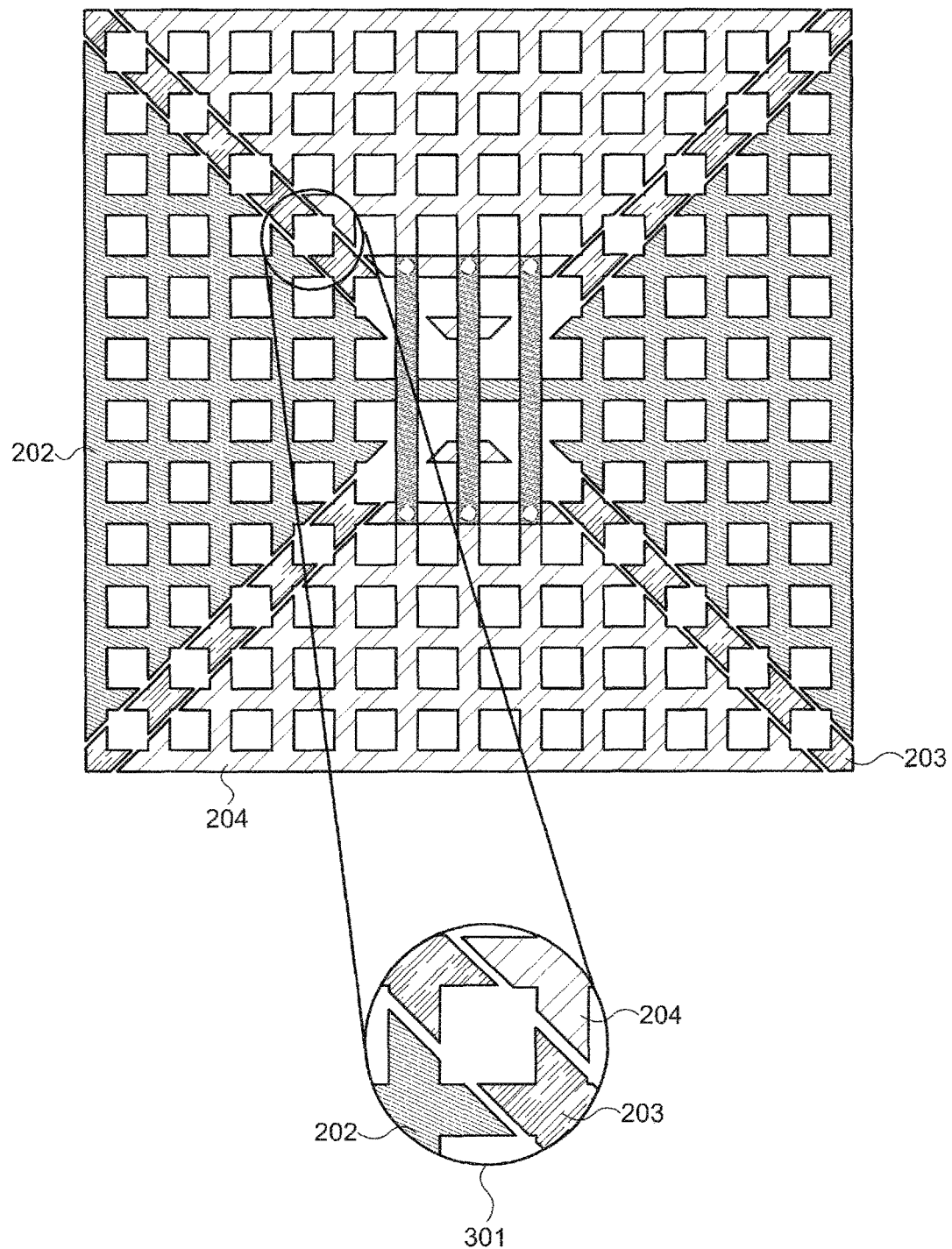
FIG. 23 is a schematic top view of a touch electrode of a display device according to an embodiment of the present invention.

Dummy electrodes 203 which are surrounded by a dotted circle 301 and are not connected to the first touch electrode 202 nor the second touch electrode 202 may be arranged in a space between the first touch electrode 202 and the second touch electrode 204 (see FIG. 23). These dummy electrodes 203 are an electrically floating pattern unconnected to any node, exist in the same layer as the first touch electrode 202 and the second touch electrode 204, and can be formed by patterning simultaneously. The formation of such dummy electrodes 203 appropriately reduces the capacitive coupling between the first touch electrode 202 and the second touch electrode 204, resulting in an increase of the change of the capacitance caused by a touch. Accordingly, a S/N ratio during operation of the touch sensor 202 can be improved.

Figure 7A:
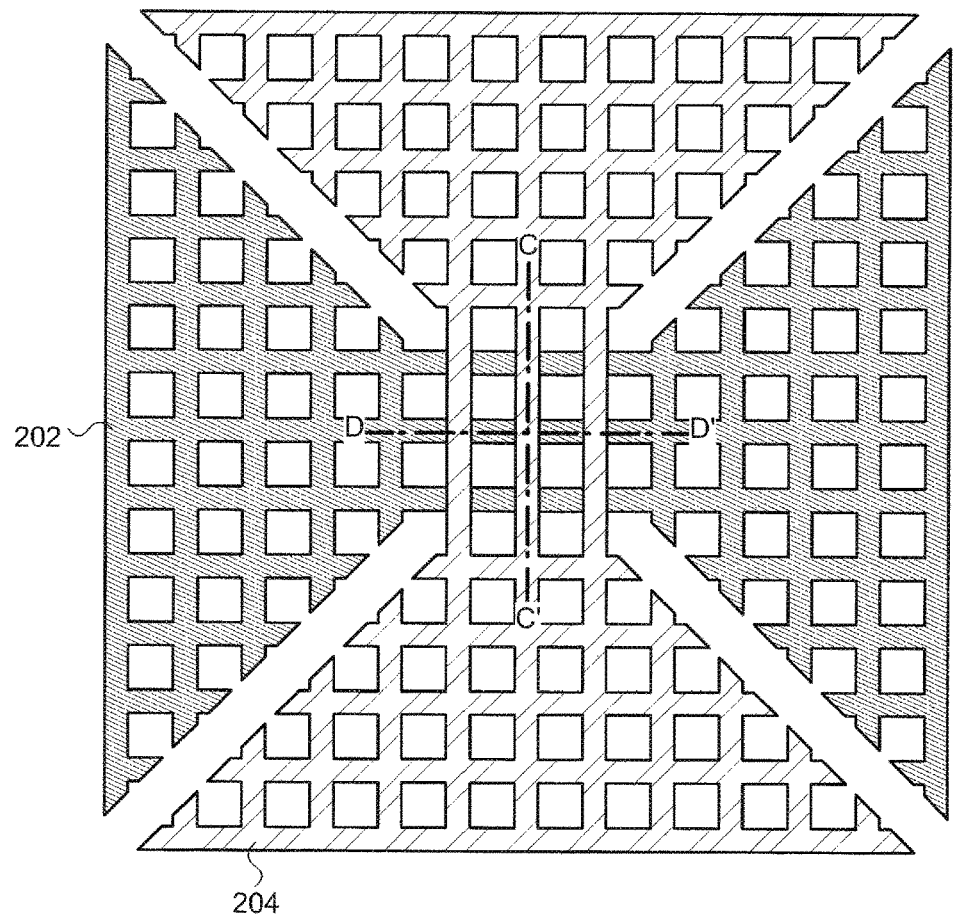
FIG. 7A is a schematic top view and FIG. 7B and FIG. 7C are schematic cross-sectional views of a touch electrode of a display device according to an embodiment of the present invention.
Figure 7B:
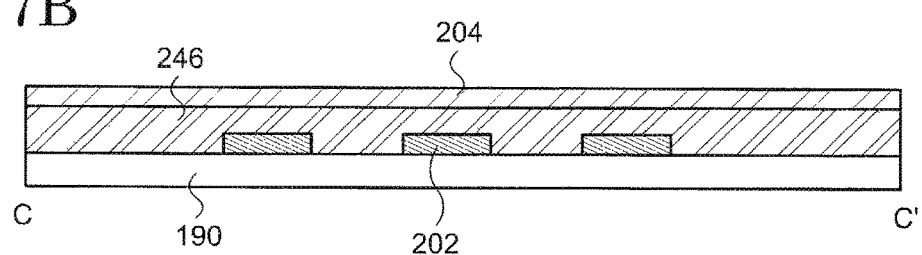
Figure 7C:
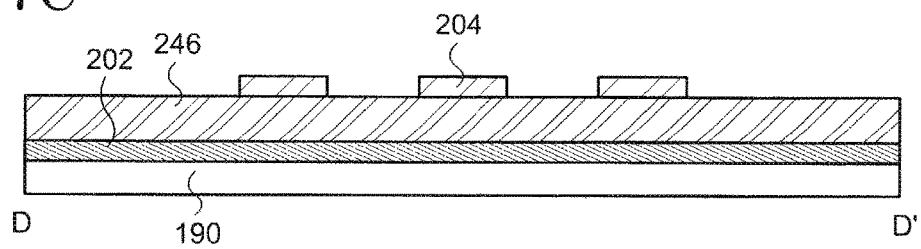

As shown in FIG. 7A as well as FIG. 7B and FIG. 7C which are schematic cross-sectional views along chain lines C-C' and D-D' of FIG. 7A, respectively, the first touch electrode 202 and the second touch electrode 204 may exist in different layers from each other. More specifically, the diamond electrodes 240 and the connection regions 242 of the first touch electrode 202 and the second touch electrode 204 may exist in different layers from each other. In this case, the interlayer insulating film 246 is arranged between the first touch electrodes 202 and the second touch electrodes 204. In the case where this structure is applied, it is not necessary to form the openings 244, which contributes to simplification of a process and improvement in yield.

As described in the Second Embodiment, the first touch electrodes 202 and the second touch electrodes 204 may include an oxide which can transmit visible light or a metal (0-valent metal) which cannot transmit visible light. Indium-tin oxide (ITO) and indium-zinc oxide are represented as the former example, and molybdenum, titanium, chromium, tantalum, copper, aluminum, tungsten, and the like are exemplified as the latter example. The formation of the first touch electrodes 202 and the second touch electrodes 204 so as to include a 0-valent metal as a main component remarkably reduces their electric resistance and time constant. As a result, a response rate as a sensor can be improved.

4. Cross-Sectional Structure

A schematic cross-sectional view of the display device 100 is shown in FIG. 8. FIG. 8 is a cross section along a chain line E-E' of FIG. 1A and schematically illustrates a cross section from the display region 102 to the first terminal 212 through the first wiring 206 and the first terminal wiring 210.

The display device 100 has the first layer 110 and the second layer 112 over the substrate 104. When the substrate 104 has flexibility, the substrate 104 may be called a base material, a base film, or a sheet substrate. As described below, transistors for controlling the sub-pixels 130, 132, and 134 and the light-emitting elements are provided in the first layer 110 to contribute to reproduction of an image. On the other hand, the touch sensor 202 is formed in the second layer 112 to contribute to detection of a touch.

(1. First Layer)

A transistor 140 is disposed over the substrate 104 with a base film 106 interposed therebetween as an optional structure. The transistor 140 includes a semiconductor film 142, a gate insulating film 144, a gate electrode 146, source/drain electrodes 148, and the like. The gate electrode 146 overlaps with the semiconductor film 142 with the gate insulating film 144 sandwiched therebetween, and a region overlapping with the gate electrode 146 is a channel region 142a of the semiconductor film 142. The semiconductor film 142 may possess source/drain regions 142b sandwiching the channel region 142a. An interlayer film 108 may be provided over the gate electrode 146, and the source/drain electrodes 148 are electrically connected to the source/drain regions 142b in openings formed in the interlayer film 108 and the gate insulating film 144.

The first terminal wiring 210 is formed over the interlayer film 108. As shown in FIG. 8, the first terminal wiring 210 may exist in the same layer as the source/drain electrodes 148. Although not shown, the first terminal wiring 210 may be configured to exist in the same layer as the gate electrode 146.

The transistor 140 is illustratively shown as a top-gate type transistor in FIG. 8. However, the structure of the transistor 140 is not limited, and the transistor 140 may be a bottom-gate type transistor, a multi-gate type transistor having a plurality of gate electrodes 146, or a dual-gate type transistor in which the semiconductor film 142 is sandwiched by two gate electrodes 146 located over and under the semiconductor film 142. An example is shown in FIG. 8 in which one transistor 140 is provided in each of the sub-pixels 130, 132, and 134. However, the sub-pixels 130, 132, and 134 each may further possess a plurality of transistors and capacitors.

A leveling film 114 is disposed over the transistor 140. The leveling film 114 has a function to absorb depressions and projections caused by the transistor 140 and other semiconductor elements and provide a flat surface.

An inorganic insulating film 150 may be formed over the leveling film 114. The inorganic insulating film 150 has a function to protect the semiconductor elements such as the transistor 140 and also forms capacitance in association with a first electrode 162 of the light-emitting element 160 described below and an electrode (not illustrated) formed under the inorganic insulating film 150 with the inorganic insulating film 150 sandwiched therebetween.

A plurality of openings is formed in the leveling film 114 and the inorganic insulating film 150. One of the openings is a contact hole 152 used for electrical connection between the first electrode 162 of the light-emitting element 160 described below and the source/drain electrode 148. Another opening is a contact hole 208 used for electrical connection of the first wiring 206 and the first terminal wiring 210. The other is an opening 154 provided to expose a part of the first terminal wiring 210. The first terminal wiring 210 exposed in the opening 154 is connected to the FPC 214 with an anisotropic conductive film 252 and the like, for example.

The light-emitting element 160 is formed over the leveling film 114 and the inorganic insulating film 150. The light-emitting element 160 is structured by the first electrode (pixel electrode) 162, a functional layer 164, and a second electrode (opposing electrode) 166. More specifically, the first electrode 162 is provided to cover the contact hole 152 and to be electrically connected to the source/drain electrode 148, by which a current is supplied to the light-emitting element 160 through the transistor 140. The partition wall 168 is arranged to cover an edge portion of the first electrode 162, by which disconnection of the functional layer 164 and the second electrode 166 formed thereover can be prevented. The functional layer 164 is disposed to cover the first electrode 162 and the partition wall 168 over which the second electrode 166 is formed. Carriers are injected to the functional layer 164 from the first electrode 162 and the second electrode 166, and recombination of the carriers takes place in the functional layer 164. The carrier recombination leads an emissive molecule in the functional layer 164 to an excited state, and light emission is obtained through a relaxation process of the excited state to a ground state. Hence, a region in which the first electrode 162 is in contact with the functional layer 164 is an emission region in each of the sub-pixels 130, 132, and 134.

A structure of the functional layer 164 may be selected as appropriate and may be configured by combing a carrier-injection layer, a carrier-transporting layer, an emission layer, a carrier-blocking layer, an exciton-blocking layer, and the like, for example. An example is shown in FIG. 8 where the functional layer 164 possesses three layers 170, 172, and 174. In this case, the layers 170, 172, and 174 may be a carrier (hole) injection/transporting layer, an emission layer, and a carrier (electron) injection/transporting layer, respectively, for example. The layer 172 serving as an emission layer can be structured to include different materials between the sub-pixels 130, 132, and 134 as shown in FIG. 8. In this case, the other layers 170 and 174 may be formed to continuously cover the sub-pixels 130, 132, and 134 and the partition wall 168 and to be shared by the sub-pixels 130, 132, and 134. Appropriate selection of materials used in the layer 172 provides emission colors different between the sub-pixels 130, 132, and 134. Alternatively, the structure of the layer 174 may be the same in the sub-pixels 130, 132, and 134. In this case, the layer 174 may be formed to continuously cover the sub-pixels 130, 132, and 134 and the partition wall 168 and to be shared by the sub-pixels 130, 132, and 134. Since this structure allows the same emission color to be output from the layer 172 of each of the sub-pixels 130, 132, and 134, a variety of colors (e.g., red, green, and blue colors) may be extracted from the respective sub-pixels 130, 132, and 134 by configuring the layer 172 to undergo white emission and using a color filter.

Note that the display device 100 may further possess connection electrodes 234 and 236 which cover the contact hole 208 and the opening 154, respectively, and are in contact with the first terminal wiring 210. These connection electrodes 234 and 236 can exist in the same layer as the first electrode 162. The formation of the connection electrodes 234 and 236 enables reduction of damage to the first terminal wiring 210 in the manufacturing process of the display device 100 and realizes electrical connection with low contact resistance.

A sealing film (passivation film) 180 is provided over the light-emitting element 160. The sealing film 180 has a function to prevent the entrance of impurities (e.g., water, oxygen, etc.) to the light-emitting element 160 or the transistor 140 from outside. As shown in FIG. 8, the sealing film 180 may include three layers 182, 184, and 186. An inorganic film including an inorganic compound can be used as the layer (first inorganic film) 182 and the layer (second inorganic film) 186, while a film (organic film) including an organic compound can be employed as the layer 184 between the first inorganic film 182 and the second inorganic film 186. The organic film 184 may be formed to absorb depressions and projections caused by the light-emitting element 160 or the partition wall 168 and to give a flat surface. Therefore, a thickness of the organic film 184 may be relatively large. As a result, a distance from the first touch electrodes 202 and the second touch electrodes 204 of the touch sensor 200 to one electrode (second electrode 166) of the light-emitting element 160 described below can be decreased. Accordingly, parasitic capacitance formed between the touch sensor 200 and the second electrode 166 can be significantly decreased.

Note that the first inorganic film 182 and the second inorganic film 186 are preferably formed so as to be confined within the display region 102. In other words, the first inorganic film 182 and the second inorganic film 186 are formed so as not to overlap with the contact hole 208 and the opening 154. This configuration enables electrical connection with low contact resistance between the first terminal wiring 210 and the FPC 214 and between the first terminal wiring 210 and the first wiring 206. Furthermore, the first inorganic film 182 and the second inorganic film 186 are preferably in direct contact with each other at an edge portion of the display region 102 (see a region surrounded by a circle 188 in FIG. 8). This structure more effectively prevents the entrance of impurities from outside and diffusion of impurities into the display region 102 because the organic film 184 which is more hydrophilic than the first inorganic film 182 and the second inorganic film 186 is sealed by the first inorganic film 182 and the second inorganic film 186.

The display device 100 further has an organic insulating film 190 over the sealing film 180. The organic insulating film 190 can be provided so as to be in contact with the second inorganic film 186 of the sealing film 180.

The first layer 110 is constructed by the variety of elements and films described above.

(2. Second Layer)

The second layer 112 includes the first touch electrodes 202, the second touch electrodes 204, the interlayer insulating film 246, the bridge wirings 248, the first wirings 206, the second wirings 216, and the like.

The first touch electrode 202 is a mesh wiring having the openings 250. This wiring is formed over the sealing film 180 and the organic insulating film 190 so as to overlap with the partition wall 168 and be arranged along the partition wall 168 (see below for further details). The first touch electrode 202 or the second touch electrode 202 may be in direct contact with the organic insulating film 190.

The interlayer insulating film 246 is formed to be in contact with and cover the first touch electrode 202. The opening is formed in the interlayer insulating film 246, and the first wiring 206 is provided to cover this opening. The first wiring 206 passes through the outside of the display region 102 and extends to the contact hole 208 (see, FIG. 1A). The first wiring 206 is further electrically connected to the first terminal wiring 210 existing in the same layer as the source/drain electrodes 148 (or the gate electrode 146) of the transistor 140 in the contact hole 208 through the connection electrode 234. With this configuration, the first touch electrode 202 is electrically connected to the first terminal wiring 210.

When the first touch electrode 202 and the second touch electrode 204 are formed in the same layer, the diamond electrodes 204 of one of the first touch electrode 202 and the second touch electrode 204 are connected to the bridge wiring 248 (see FIG. 4A, FIG. 5A, and FIG. 5B). In this case, the first wiring 206 exists in the same layer as the bridge wiring 248, which allows the first wiring 206 and the bridge wiring 248 to be simultaneously prepared.

In contrast, when the first touch electrode 202 and the second touch electrode 204 are configured to exist in different layers from each other (see FIG. 7A to FIG. 7C), the first wiring 206 exists in the same layer as and is simultaneously formed with the upper one of the first touch electrode 202 and the second touch electrode 204.

(3. Other Structures)

The display device 100 may further possess a circular polarizing plate 260 overlapping with the display region 102 as an optional structure. The circular polarizing plate 260 may have a stacked structure of a ¼λ plate 262 and a linear polarizing plate 264 arranged thereover. When light incident on the display device 100 from outside is transformed to linearly polarized light by the linear polarizing plate 264 and then passes through the ¼λ plate 262, the light is transformed to clockwise circularly polarized light. Reflection of this circularly polarized light by the first electrode 162, the first touch electrode 202, or the second touch electrode 204 results in counterclockwise circularly polarized light which is transformed to linearly polarized light after passing through the ¼λ plate 262 again. The linearly polarized light at this time cannot pass through the linear polarizing plate 264 because the polarization plane thereof perpendicularly intersects that of the linearly polarized light before the reflection. As a result, the formation of the circular polarizing plate 260 suppresses reflection of outside light and allows production of a high-contrast image.

An organic protection film 266 may be disposed as a protection film between the circular polarizing plate 260 and the second layer 112. This organic protection film 266 has a function to physically protect the display device 100 as well as a function to adhere the circular polarizing plate 260 to the second layer 112. Furthermore, a cover film 268 may be provided to the display device 100 as an optional structure. The cover film 268 has a function to physically protect the circular polarizing plate 260.

5. Layout of the Touch Electrode and Pixel

Figure 9:
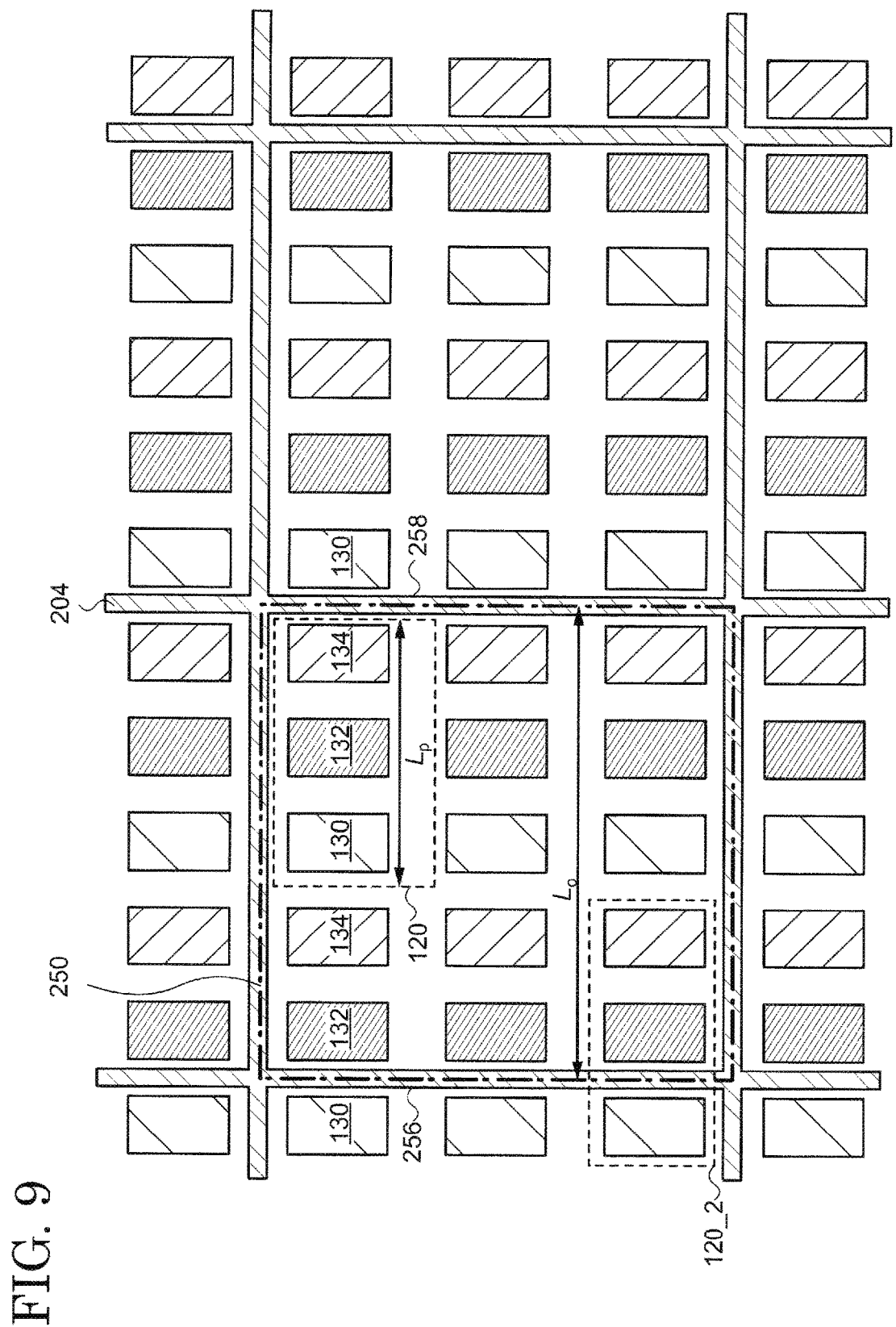
FIG. 9 is a layout of a touch electrode and pixels of a display device according to an embodiment of the present invention.

As described above, each of the first touch electrodes 202 and the second touch electrodes 204 according to the present embodiment is a mesh wiring having a lattice form. In other words, each possesses openings 250 arranged in a matrix form, and the wirings of the first touch electrodes 202 and the second touch electrodes 204 overlap with the partition wall 168. Additionally, as shown in FIG. 9, these wirings are formed between the adjacent sub-pixels. That is, they are arranged along the partition wall 168 as shown in the cross section of FIG. 8. Hence, when the sub-pixels 130, 132, and 134 are arranged in a stripe form, the sub-pixels 130, 132, and 134 each overlap with the opening 250 as shown in FIG. 9. In other words, the sub-pixels 130, 132, and 134 are each arranged in a region overlapping with the opening 250 of the first touch electrodes 202 or the second touch electrodes 204, but do not overlap with the mesh wirings of the first touch electrode 202 and the second touch electrode 204.

Here, a case is considered where the sub-pixels 130, 132, and 134 are defined as a first sub-pixel, a second sub-pixel, and a third sub-pixel, respectively, colors provided by the sub-pixels 130, 132, and 134 are a first color, a second color, and a third color, respectively, and the first color, the second color, and the third color are different from one another. In the display device 100, among one of the number of the first sub-pixels 130, the number of the second sub-pixels 132, and the number of the third sub-pixels 134, which overlap with one opening 250, at least one is different from the other two. For example, in the structure shown in FIG. 9, three first sub-pixels 130, six second sub-pixels 132, and six third sub-pixels 134 are arranged in one opening 250, and the number of the first sub-pixels 130 is different from the number of the second sub-pixels 132 and the number of the third sub-pixels 134.

Alternatively, the openings 250 can be provided so that a length $L_o$ of a side forming the opening 250 is (n+k/m) times the length $L_p$ of a side of the pixel 120. Here, a vector of the length $L_o$ and a vector of the length $L_p$ are parallel to each other, n is an arbitrary integer, m is the number of columns of the sub-pixels included in one pixel 120 and arranged in a direction perpendicular to the vector of the length $L_p$, and k is a natural number smaller than m. In the stripe arrangement shown in FIG. 9, m is three, and $L_o$ is (1+2/3) times $L_p$. Note that the vectors of the length $L_o$ and the length $L_p$ may extend from the scanning-line driver circuit 126 and be parallel to scanning lines crossing the display region 102, for example.

When focus is placed on a pair of sides of the opening 250 perpendicular to the vector of the length $L_o$ (hereinafter, referred to as a first side 256 and a second side 258) in such a layout, a combination of colors provided by two sub-pixels which are the closest to and sandwich the first side 256 is different from a combination of colors provided by two sub-pixels which are the closest to and sandwich the second side 258. Alternatively, in the case where the combination of colors is the same, a positional relationship of these sub-pixels is different. In the example of FIG. 9, two sub-pixels which are the closest to and sandwich the first side 256 of the opening 250 are the first sub-pixel 130 giving the first color and the second sub-pixel 132 giving the second color. On the other hand, two sub-pixels which are the closest to and sandwich the second side 258 of the opening 250 are the third sub-pixel 134 giving the third color and the first sub-pixel 130 giving the first color.

Furthermore, at least one side of the opening 250 crosses the pixel 120 in such a layout. In the example of FIG. 9, the first side 256 of the opening 250 crosses the pixel 120_2.

Figure 10:
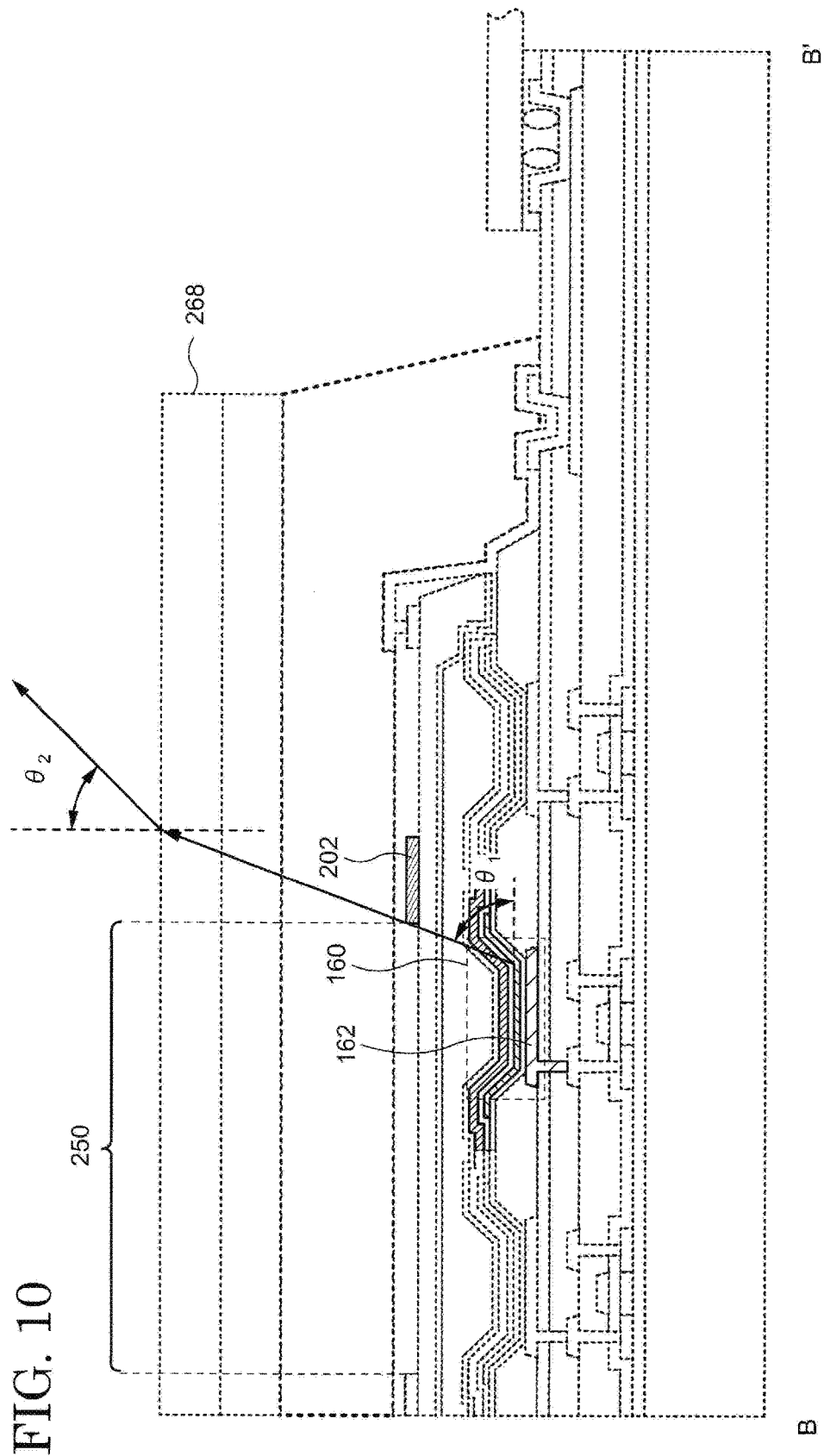
FIG. 10 is a schematic cross-sectional view of a display device according to an embodiment of the present invention.

As described above, the first touch electrode 202 and the second touch electrode 204 are mesh wirings arranged along the partition wall 168. When the emitted light of the light-emitting element 160 is extracted through the second electrode 166, a part of the emitted light is blocked by the first touch electrode 202 or the second touch electrode 204 as shown in FIG. 10. Namely, light emitted at a certain angle (critical angle) $\theta_1$ of a straight line connected between an edge portion of the emission region of the light-emitting element 160 and an edge portion of the opening 250 with respect to a surface of the first electrode 162 and light emitted at an angle less than the critical angle $\theta_1$ cannot be extracted outside. This critical angle is approximately 70° when a horizontal distance and a vertical distance between the edge portion of the emission region of the light-emitting element 160 and the edge portion of the opening 250 are 5 μm and 14 μm, respectively, for example. When the critical angle is 70°, light emitted at this angle is refracted at an interface between the cover film 268 and the outside (air) as shown in FIG. 10. When a refraction index of the cover film 268 is 1.5, a light-emission angle $\theta_2$ of the light extracted from a surface of the cover film 268 is 30.9° from a normal line of the cover film 268. Hence, when a display device 100 is observed at a viewing angle larger than this light-emission angle $\theta_2$, chromaticity as well as luminance of an image is decreased because the emitted light is partly blocked. Accordingly, when the side forming the opening 250 is always sandwiched by the first sub-pixel 130 and the second sub-pixel 132, for example, viewing-angle dependence of chromaticity provided by the sub-pixels 130 and 132 is increased, while that provided by the third sub-pixel 134 is low.

On the contrary, the application of the aforementioned layout makes the viewing-angle dependence of chromaticity provided by each sub-pixel uniform because the sub-pixels giving different colors adjoin the mesh wiring with the same probability. As a result, the viewing-angle dependence of color on the entire image can be eliminated.

Figure 11:
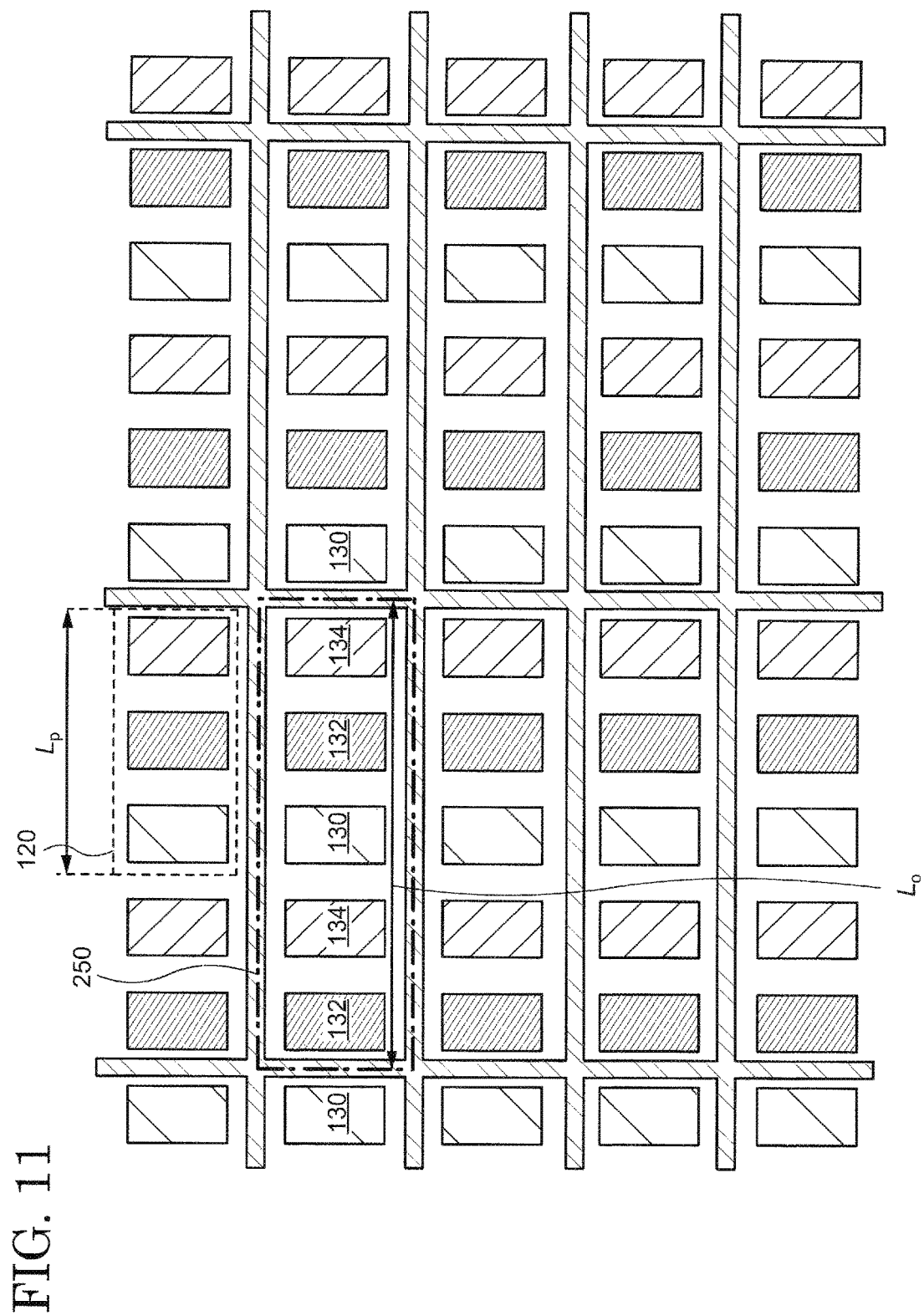
FIG. 11 is a layout of a touch electrode and pixels of a display device according to an embodiment of the present invention.
Figure 12:
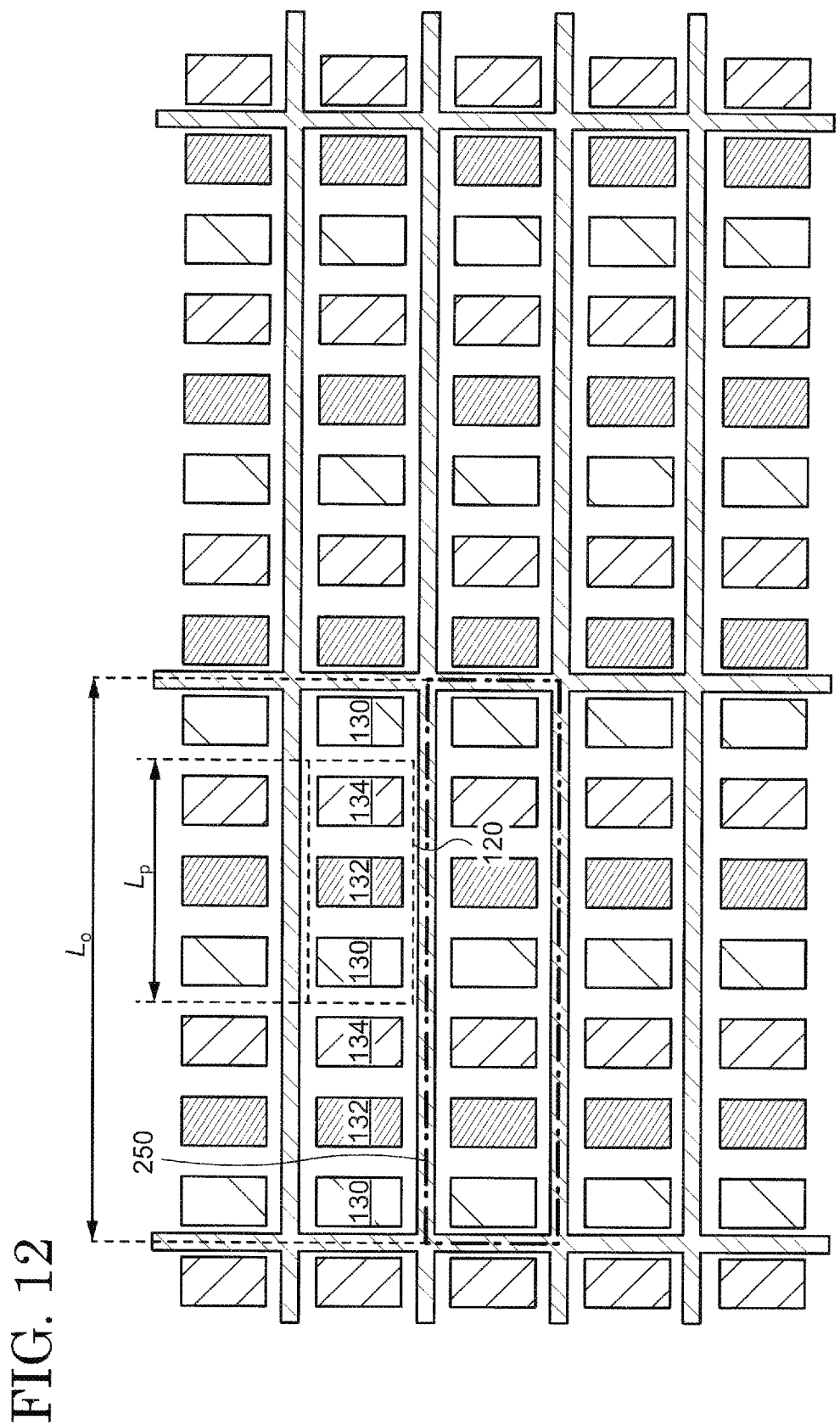
FIG. 12 is a layout of a touch electrode and pixels of a display device according to an embodiment of the present invention.
Figure 13:
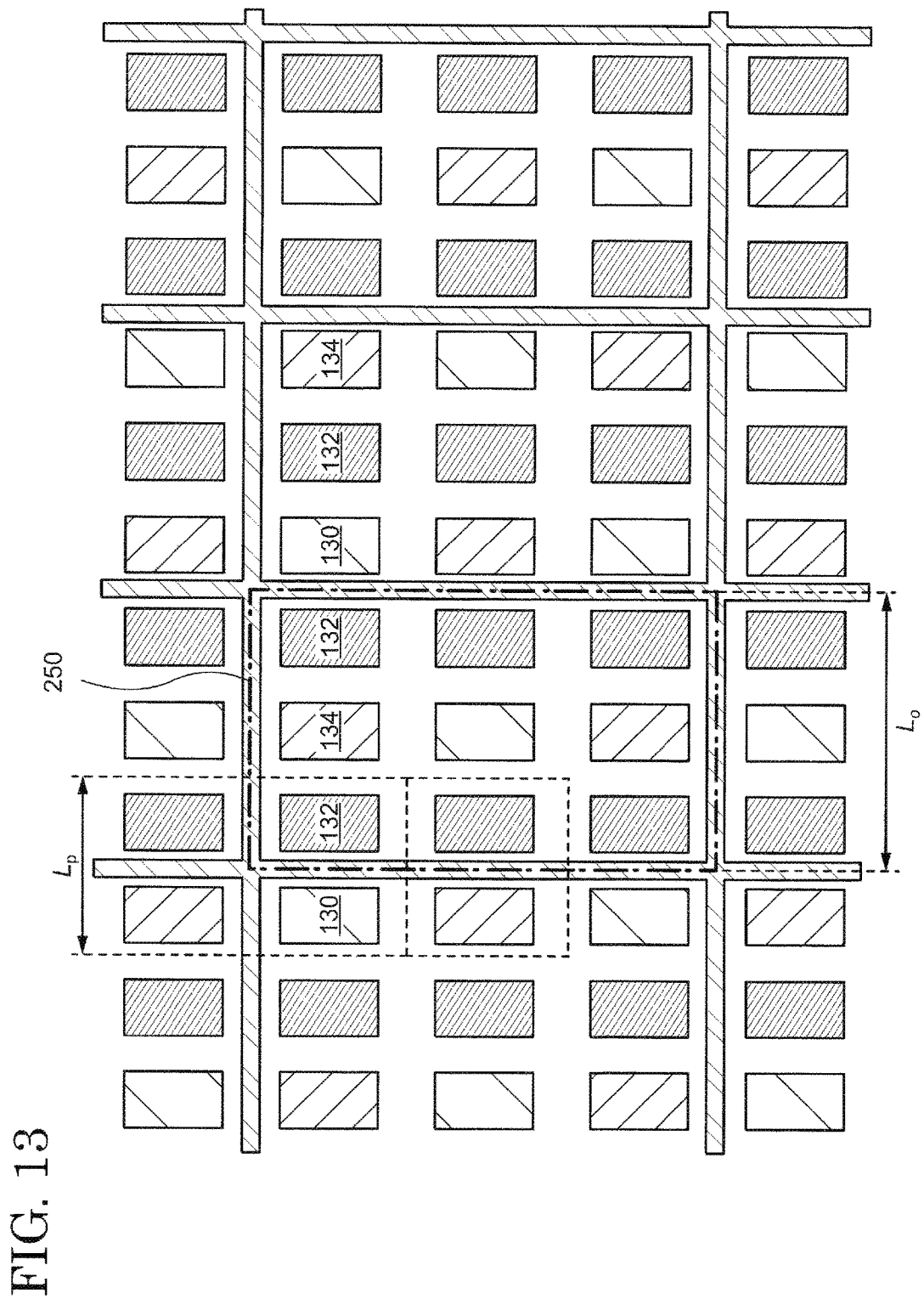
FIG. 13 is a layout of a touch electrode and pixels of a display device according to an embodiment of the present invention.

The layout of the pixels 120, the sub-pixels included therein, and the openings 250 of the first touch electrode 202 and the second touch electrode 204 is not limited to that shown in FIG. 9, and the layouts illustrated in FIG. 11 to FIG. 14 can be employed. An example is demonstrated in FIG. 9 in which one opening 250 overlaps with the pixels 120 arranged in a plurality of rows. The number of the rows of the pixels 120 overlapping with one opening 250 may be one. Specifically, as shown in FIG. 11, the sides of the opening 250 may be located in every row of the pixels 120. The layout shown in FIG. 12 is different from that shown in FIG. 11 in that the length $L_o$ of a side of the opening 250 is (2+1/3) times the length $L_p$ of a side of the pixel 120. The layout shown in FIG. 13 is different from other layouts in that two sub-pixels are provided in one pixel 120. Here, the length $L_o$ of a side of the opening 250 is (1+1/3) times the length $L_p$ of a side of the pixel 120.

Figure 14:
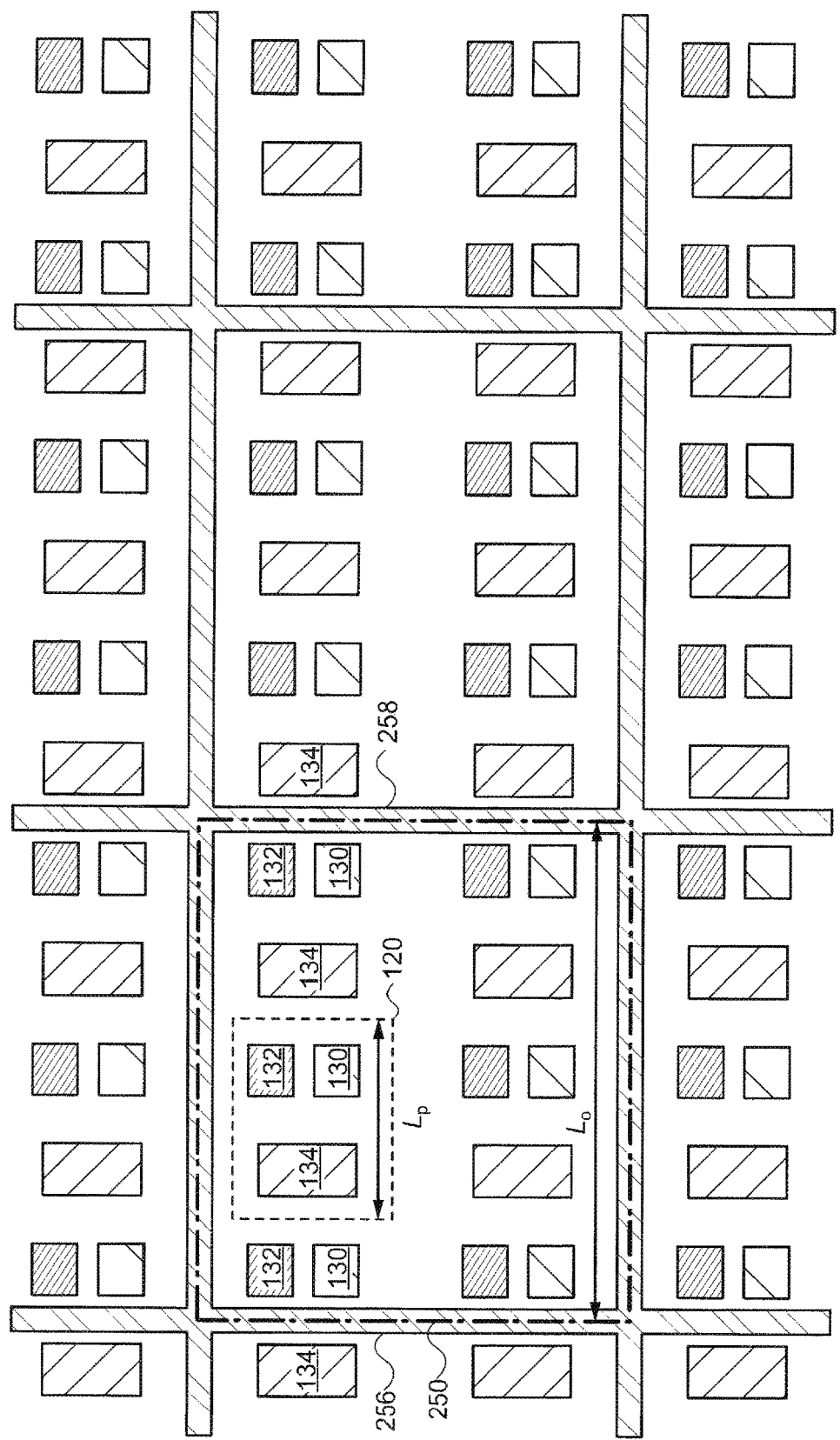
FIG. 14 is a layout of a touch electrode and pixels of a display device according to an embodiment of the present invention.

In the layout shown in FIG. 14, while the number of the sub-pixels disposed in one pixel 120 is three, one sub-pixel has a different area from the others. In this layout, the sub-pixels are arranged in two columns along a direction perpendicular to the length $L_p$ in each pixel 120. Therefore, m is two, and the length $L_o$ of a side of the opening 250 is (2+1/2) times the length $L_p$ of a side of the pixel 120.

In each of the layouts, among the number of the first sub-pixels 130, the number of the second sub-pixels 132, and the number of the third sub-pixels 134, which overlap with one opening 250, one is different from the other two. Additionally, the length $L_o$ of a side of the opening 250 is (n+k/m) times the length $L_p$ of a side of the pixel 120. When one opening 250 is considered, a combination of colors provided by two sub-pixels which are the closest to and sandwich the first side 256 is different from a combination of colors provided by two sub-pixels which are the closest to and sandwich the second side 258. In the case of FIG. 14, the third sub-pixel 134 and the first sub-pixel 130 are located on the left and right sides, respectively, with respect to the two sub-pixels which are the closest to and sandwiching the first side 256. On the other hand, with respect to the two sub-pixels which are the closest to and sandwiching the second side 258, the first sub-pixel 130 and the third sub-pixel 134 are located on the left and right sides. Additionally, at least one side of the opening 250 crosses the pixel 120. Hence, the viewing-angle dependence of chromaticity provided by each sub-pixel is made uniform, and the viewing-angle dependence of chromaticity on the entire image can be eliminated.

The first touch electrode 202 and the second touch electrode 204 of the touch sensor 200 mounted on the display device 100 according to the present embodiment can be formed as metal wirings with a mesh form having 0-valent metal as a main component. Therefore, electrical resistance of the first touch electrode 202 and the second touch electrode 204 is low, which allows reduction of a time constant in response and improves a response rate as a sensor. Additionally, the first electrode 202 and the second touch electrode 204 can be formed with photolithography as described below, which enables arrangement of the first touch electrode 202 and the second touch electrode 204 with higher accuracy compared with the arrangement provided by the conventional method in which a touch panel is separately fabricated and then mounted on a display device.

Moreover, the circular polarizing plate 260 may be provided to the display device 100. Hence, light incident from outside and then reflected by the first touch electrode 202 and the second touch electrode 204 is not output from the display device 100, by which a high-quality image with high contrast can be provided.

As described above, the first touch electrode 202 and the second touch electrode 204 have openings 250, and the wirings forming the openings 250 are arranged along the partition wall 168 between the light-emitting elements 160. Hence, each sub-pixel is located in the opening 250. An electrode for a touch sensor is conventionally prepared with a light-transmitting conductive film such as ITO and arranged to overlap with sub-pixels, which causes reduction of luminance of each pixel 120 due to light absorption by the light-transmitting conductive film. On the other hand, light emitted from the pixel 120 is not absorbed or blocked by the touch sensor in the display device 100 of the present embodiment as long as the viewing angle does not exceed the critical angle. Hence, light emitted from the light-emitting element 160 can be efficiently utilized, which contributes to a reduction of power consumption.

In the display device 100, signals provided to the first touch electrodes 202 and the second touch electrodes 204 are input through the first terminal wirings 210 and the second terminal wirings 220 existing in the same layer as the source/drain electrodes 148 or the gate electrodes 146 of the transistors 140 for controlling the display region 102. Therefore, the terminals for inputting signals to the touch sensor 200 and signals to the display region 102 (i.e., the first terminals 212, the second terminals 222, and the third terminals 122) can be formed on the same substrate, resulting in a reduction of the number of FPCs 214.

<Second Embodiment>

In the present embodiment, a manufacturing method of the display device 100 described in the First Embodiment is described by using FIG. 8 and FIG. 15A to FIG. 22. FIG. 15A to FIG. 22 correspond to the cross section shown in FIG. 8. Explanation of the content the same as that described in the First Embodiment may be omitted.

1. First Layer

As shown in FIG. 15A, the base film 106 is first prepared over the substrate 104. The substrate 104 has a function to support the semiconductor elements such as the transistor 140 included in the display region 102 and the touch sensor 200. Thus, a material with heat resistance to the process temperature of a variety of elements formed thereover and chemical stability to chemicals used in the process may be used for the substrate 104. Specifically, the substrate 104 may include glass, quartz, plastics, a metal, ceramics, and the like.

When flexibility is provided to the display device 100, a base material may be formed over the substrate 104. In this case, the substrate 104 is also called a supporting substrate. The base material is an insulating film with flexibility and may include a material selected from a polymer material exemplified by a polyimide, a polyamide, a polyester, and polycarbonate. The base material may be formed by using a wet-type film-forming method such as a printing method, an ink-jet method, a spin-coating method, and a dip-coating method or a lamination method.

The base film 106 is a film having a function to prevent impurities such as an alkaline metal from diffusing to the transistor and the like from the substrate 104 (and the base material) and may include an inorganic insulator such as silicon nitride, silicon oxide, silicon nitride oxide, and silicon oxynitride. The base film 106 can be formed with a chemical vapor deposition method (CVD method), a sputtering method, or the like to have a single-layer or a stacked-layer structure. When an impurity concentration of the substrate 104 is low, the base film 106 may not be formed or formed to only partly cover the substrate 104.

Next, the semiconductor film 142 is formed (FIG. 15A). The semiconductor film 142 may include a Group 14 element such as silicon. Alternatively, the semiconductor film 142 may include an oxide semiconductor. An oxide of a Group 13 element such as indium and gallium are exemplified as an oxide semiconductor, and a mixed oxide of indium and gallium (IGO) is represented. When an oxide semiconductor is used, the semiconductor film 142 may further contain a Group 12 element, and a mixed oxide including indium, gallium, and zinc (IGZO) is represented as an example. There is no limitation to crystallinity of the semiconductor film 142, and the semiconductor film 142 may include a single crystalline, a polycrystalline, a microcrystalline, or an amorphous state.

When the semiconductor film 142 includes silicon, the semiconductor film 142 may be formed with a CVD method by using a silane gas as a starting material. Crystallization may be conducted on the formed amorphous silicon by performing a heat treatment or application of light such as a laser light. When an oxide semiconductor is included in the semiconductor film 142, the semiconductor film 142 can be formed with a sputtering method and the like.

Next, the gate insulating film 144 is formed to cover the semiconductor film 142 (FIG. 15A). The gate insulating film 144 may have a single-layer structure or a stacked-layer structure and can be formed with the same method as that of the base film 106.

Next, the gate electrode 146 is prepared over the gate insulating film 144 with a sputtering method or a CVD method (FIG. 15B). The gate electrode 146 can be formed with a metal such as titanium, aluminum, copper, molybdenum, tungsten, and tantalum or an alloy thereof to have a single-layer or a stacked layer structure. For example, a structure may be employed in which a metal with high conductivity, such as aluminum or copper, is sandwiched by a metal with a relatively high melting point, such as titanium, tungsten, or molybdenum.

Figure 16A:
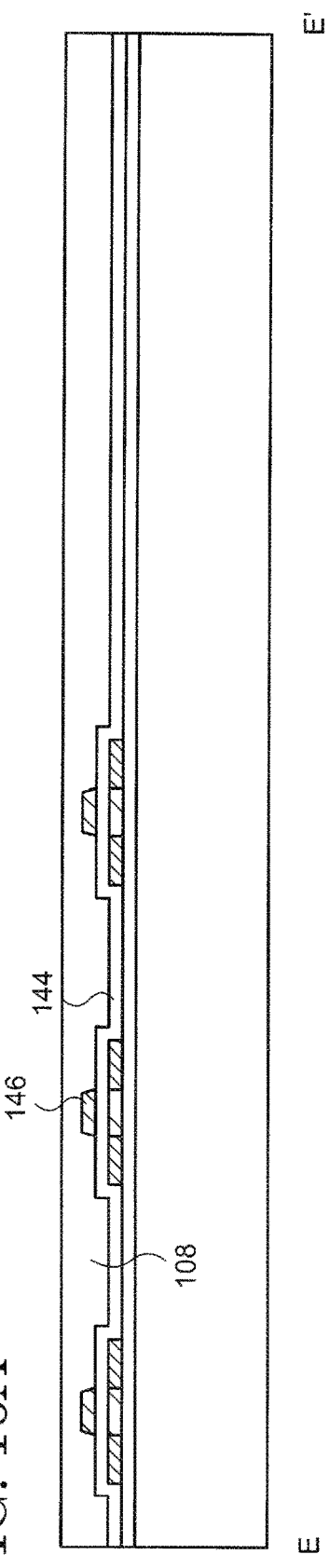
FIG. 16A and FIG. 16B are schematic cross-sectional views explaining a manufacturing method of a display device according to an embodiment of the present invention.

Next, the interlayer film 108 is formed over the gate electrode 146 (FIG. 16A). The interlayer film 108 may have a single-layer structure or a stacked-layer structure and can be formed with the same method as that of the base film 106. In the case of a stacked-layer structure, a film including an inorganic compound may be stacked after forming a layer including an organic compound, for example.

Next, etching is performed on the interlayer film 108 and the gate insulating film 144 to form the openings reaching the semiconductor film 142. The openings may be formed by conducting plasma etching in a gas including a fluorine-containing hydrocarbon, for example.

Figure 16B:
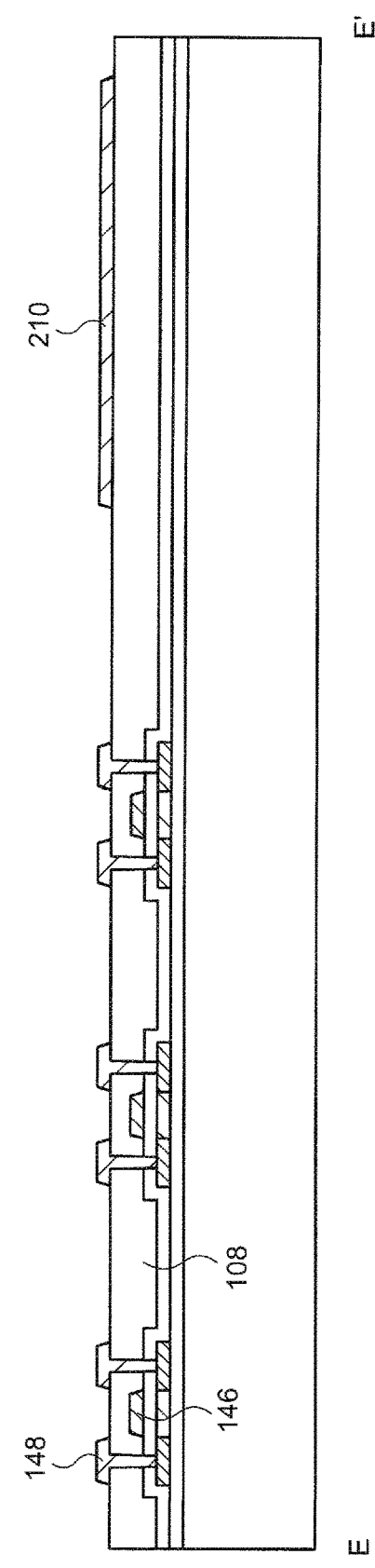

Next, a metal film is formed to cover the openings and processed with etching to form the source/drain electrodes 148. In the present embodiment, the first terminal wiring 210 is formed simultaneously with the source/drain electrodes 148 (FIG. 16B). Hence, the source/drain electrodes 148 and the first terminal wiring 210 exist in the same layer. The metal film may have the same structure as the gate electrode 146 and can be formed with the same method as that of the gate electrode 146.

Figure 17A:
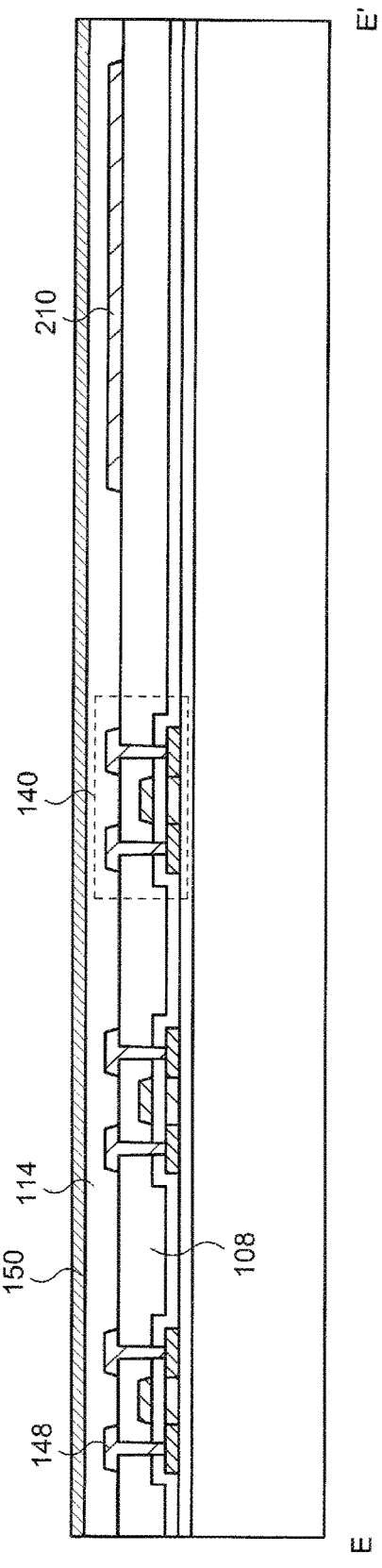
FIG. 17A and FIG. 17B are schematic cross-sectional views explaining a manufacturing method of a display device according to an embodiment of the present invention.

Next, the leveling film 114 is formed to cover the source/drain electrodes 148 and the first terminal wiring 210 (FIG. 17A). The leveling film 114 has a function to absorb depressions and projections caused by the transistor 114 and the first terminal wiring 210 and to result in a flat surface. The leveling film 114 can be formed with an organic insulator. A polymer material such as an epoxy resin, an acrylic resin, a polyimide, a polyamide, a polyester, a polycarbonate, and a polysiloxane is exemplified as an organic insulator, and the leveling film 114 can be formed with the wet-type film-forming method and the like.

Next, the inorganic insulating film 150 is formed over the leveling film 114 (FIG. 17A). As mentioned above, the inorganic insulating film 150 not only functions as a protection film for the transistor 140 but also forms capacitance in association with the first electrode 162 of the light-emitting element 160 formed later. Hence, it is preferred to use a material with relatively high permittivity. For instance, the inorganic insulating film 150 can be formed with silicon nitride, silicon nitride oxide, silicon oxynitride, or the like by applying a CVD method or a sputtering method.

Figure 17B:
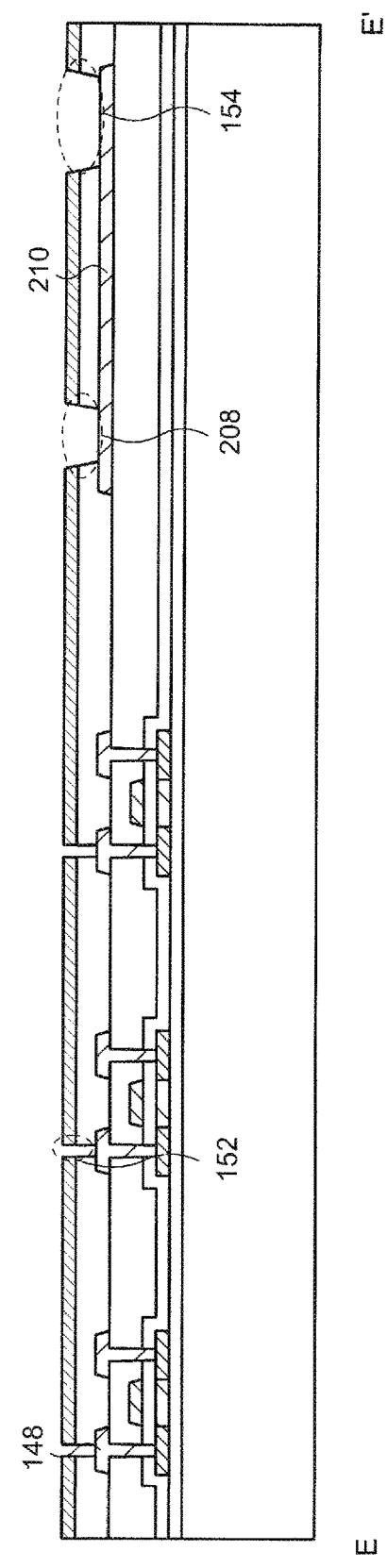

Next, as shown in FIG. 17B, etching is conducted on the inorganic insulating film 150 and the leveling film 114 by using the source/drain electrodes 148 and the first terminal wiring 210 as an etching stopper to form the opening 154 and the contact holes 152 and 208. After that, the first electrode 162 and the connection electrodes 234 and 236 are formed to cover the openings or the contact holes (FIG. 18A).

Here, a region in which the connection electrode 236 is fabricated, that is, the opening 154 later becomes a region to which the FPC 214 is connected through an anisotropic conductive film and the like. Therefore, its area is much larger than that of a region in which the connection electrode 234 is formed, i.e., the contact hole 208. Although the size depends on a pitch of terminals of the FPC 214, the former has a width of 10 µm to 50 µm and a length of 1 mm to 2 mm. On the other hand, an area of several micrometers square to several tens of micrometers square is sufficient for the latter. Miniaturization of the opening 154 is limited in view of the mounting process of the FPC 214. However, the contact hole 208 may possess a size as small as possible as long as the conductive layers (the first terminal wiring 210, the connection electrode 234, and the first wiring 206 in this case) can be connected with sufficiently low contact resistance.

When the light emitted from the light-emitting element 160 is extracted from the second electrode 166, the first electrode 162 is configured to reflect visible light. In this case, a metal with high reflectance, such as silver or aluminum, or an alloy thereof is used for the first electrode 162. Alternatively, a film of a conductive oxide with a light-transmitting property is formed over a film including this metal or alloy. ITO, IZO, and the like are exemplified as a conductive oxide. When the light emitted from the light-emitting element 160 is extracted from the first electrode 162, the first electrode 162 may be formed by using ITO or IZO.

In the present embodiment, the first electrode 162 and the connection electrodes 234 and 236 are prepared over the inorganic insulating film 150. Hence, the first electrode 162 and the connection electrodes 234 and 236 can be prepared by forming a film of the aforementioned metal to cover the opening 154 and contact holes 152 and 208 and then forming a film including a conductive oxide which can transmit visible light, followed by processing with etching, for example. Alternatively, a film of a conductive oxide, a film of the aforementioned metal, and a film of a conductive oxide may be sequentially stacked to cover the opening 154 and the contact holes 152 and 208 and then subjected to an etching process. Alternatively, a conductive oxide may be formed to cover the opening 154 and the contact holes 152 and 208, and then a stacked film of a film of a conductive oxide, a film of the aforementioned metal, and a film of a conductive oxide may be prepared to selectively cover the contact hole 152.

Next, the partition wall 168 is prepared to cover the edge portion of the first electrode 162 (FIG. 18B). The partition wall 168 absorbs steps caused by the first electrode 162 and the like and electrically insulates the first electrodes 162 of the adjacent sub-pixels. The partition wall 168 may be formed with a material usable for the leveling film 114, such as an epoxy resin and an acrylic resin, by a wet-type film-forming method.

Next, the functional layer 164 and the second electrode 166 of the light-emitting element 160 are formed to cover the first electrode 162 and the partition wall 168 (FIG. 18B). The functional layer 164 mainly includes an organic compound and can be formed by applying a wet-type film-forming method such as an ink-jet method and a spin-coating method or a dry-type film-forming method such as an evaporation method.

When the light emitted from the light-emitting element 160 is extracted from the first electrode 162, a metal such as aluminum, magnesium, or silver or an alloy thereof may be used for the second electrode 166. On the contrary, when the light emitted from the light-emitting element 160 is extracted from the second electrode 166, a conductive oxide with a light-transmitting property, such as ITO, may be used as the second electrode 166. Alternatively, a film containing the aforementioned metal may be formed at a thickness which permits visible light to pass therethrough. In this case, a conductive oxide with a light-transmitting property may be further stacked.

Figure 19A:
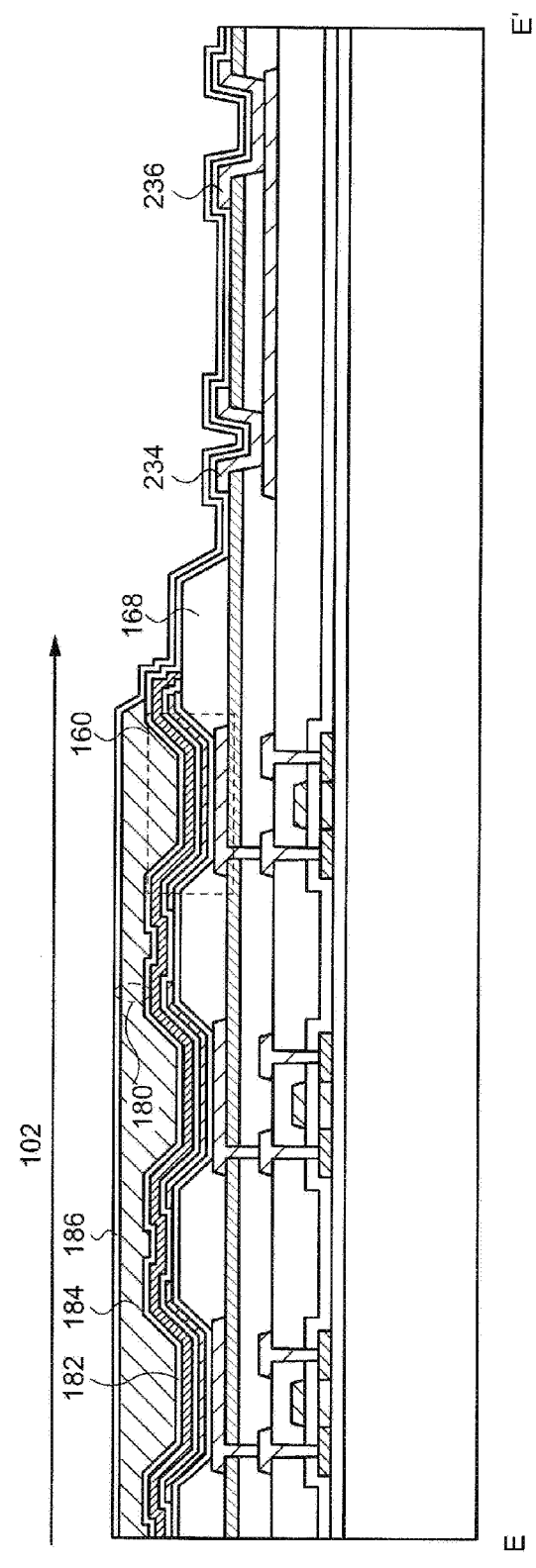
FIG. 19A and FIG. 19B are schematic cross-sectional views explaining a manufacturing method of a display device according to an embodiment of the present invention.

Next, the sealing film 180 is formed. As shown in FIG. 19A, the first inorganic film 182 is first formed to cover the light-emitting element 160 and the connection electrodes 234 and 236. The first inorganic film 182 may contain an inorganic material such as silicon nitride, silicon oxide, silicon nitride oxide, and silicon oxynitride and can be prepared with the same method as that of the base film 106.

Next, the organic film 184 is formed (FIG. 19A). The organic film 184 may contain an organic resin including an acrylic resin, a polysiloxane, a polyimide, or a polyester. Additionally, the organic film 184 may be formed at a thickness which allows depressions and projections caused by the partition wall 168 to be absorbed and gives a flat surface as shown in FIG. 19A. The organic film 184 is preferred to be selectively formed within the display region 102. That is, it is preferred that the organic film 184 be formed so as not to overlap with the connection electrodes 234 and 236. The organic film 184 can be formed with a wet-type film-forming method such as an ink-jet method. Alternatively, the organic film 184 may be prepared by atomizing or gasifying oligomers serving as a raw material of the aforementioned polymer materials under a reduced pressure, spraying the first inorganic film 182 with the oligomers, and then polymerizing the oligomers.

After that, the second inorganic film 186 is formed (FIG. 19A). The second inorganic film 186 may have the same structure as that of the first inorganic film 182 and may be formed with the same method as that of the first inorganic film 182. The second inorganic film 186 may be formed to cover not only the organic film 184 but also the connection electrodes 234 and 236, by which the organic film 184 can be sealed by the first inorganic film 182 and the second inorganic film 186.

Figure 19B:
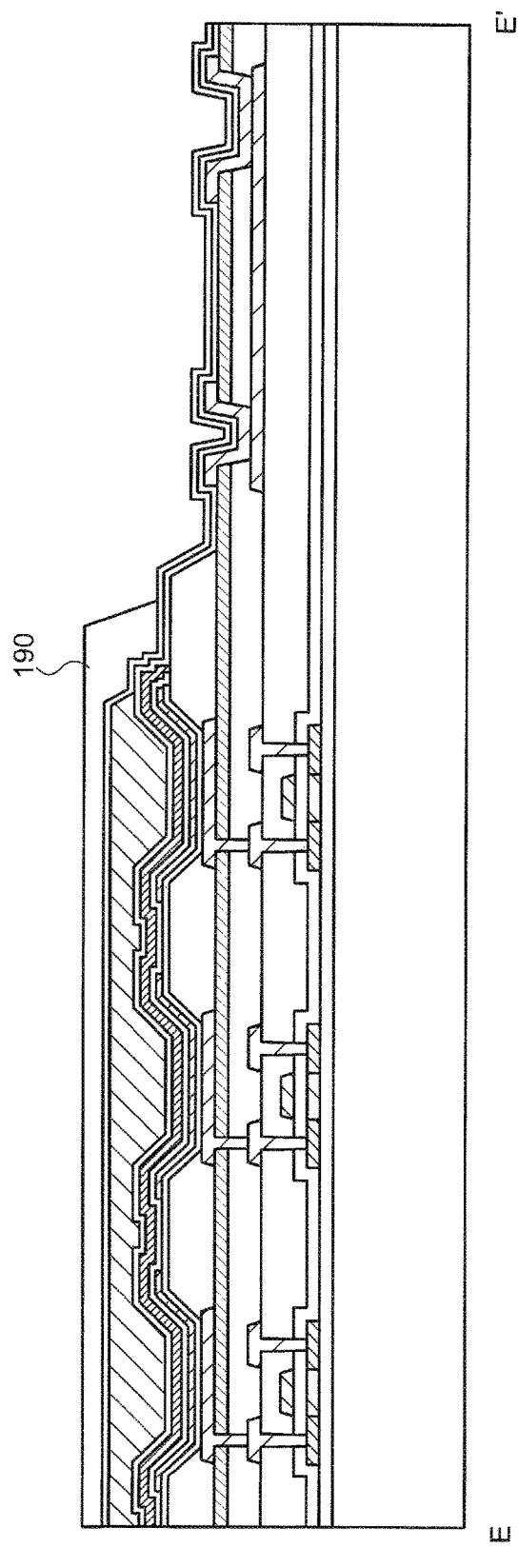
Figure 20A:
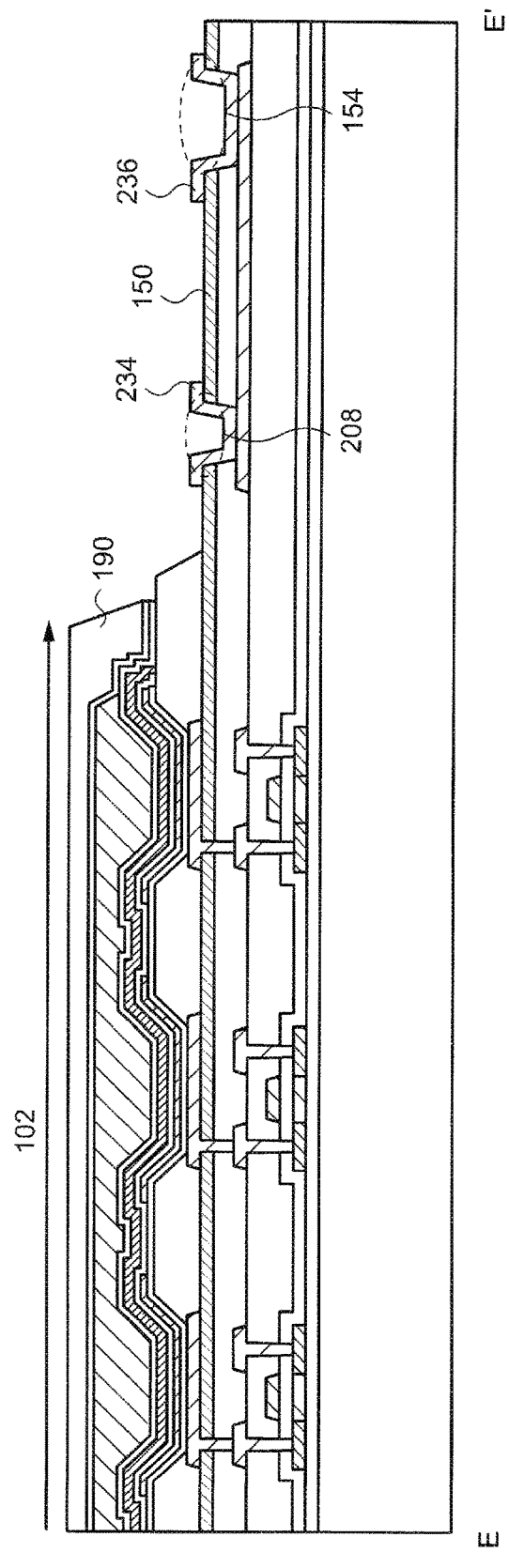
FIG. 20A and FIG. 20B are schematic cross-sectional views explaining a manufacturing method of a display device according to an embodiment of the present invention.

Next, the organic insulating film 190 is formed (FIG. 19B). The organic insulating film 190 may include the same material as that of the organic film 184 of the sealing film 180 and may be prepared with the same method as that of the organic film 184. It is preferred that the organic insulating film 190 be selectively formed within the display region 102 to cover a region in which the first inorganic film 182 and the second inorganic film 186 are in contact with each other and not to overlap with the connection electrodes 234 and 236 as shown in FIG. 19B. After that, a part of the first inorganic film 182 and a part of the second inorganic film 186, which are exposed from the organic insulating film 190, are removed with etching by using the organic insulating film 190 as a mask (FIG. 20A). With this process, the connection electrodes 234 and 236 are exposed in the contact hole 208 and the opening 154 arranged outside the display region 102. At this time, the inorganic insulating film 150 may be partly etched, resulting in a reduction of its thickness.

Through the above processes, the first layer 110 is fabricated.

2. Second Layer

Figure 20B:
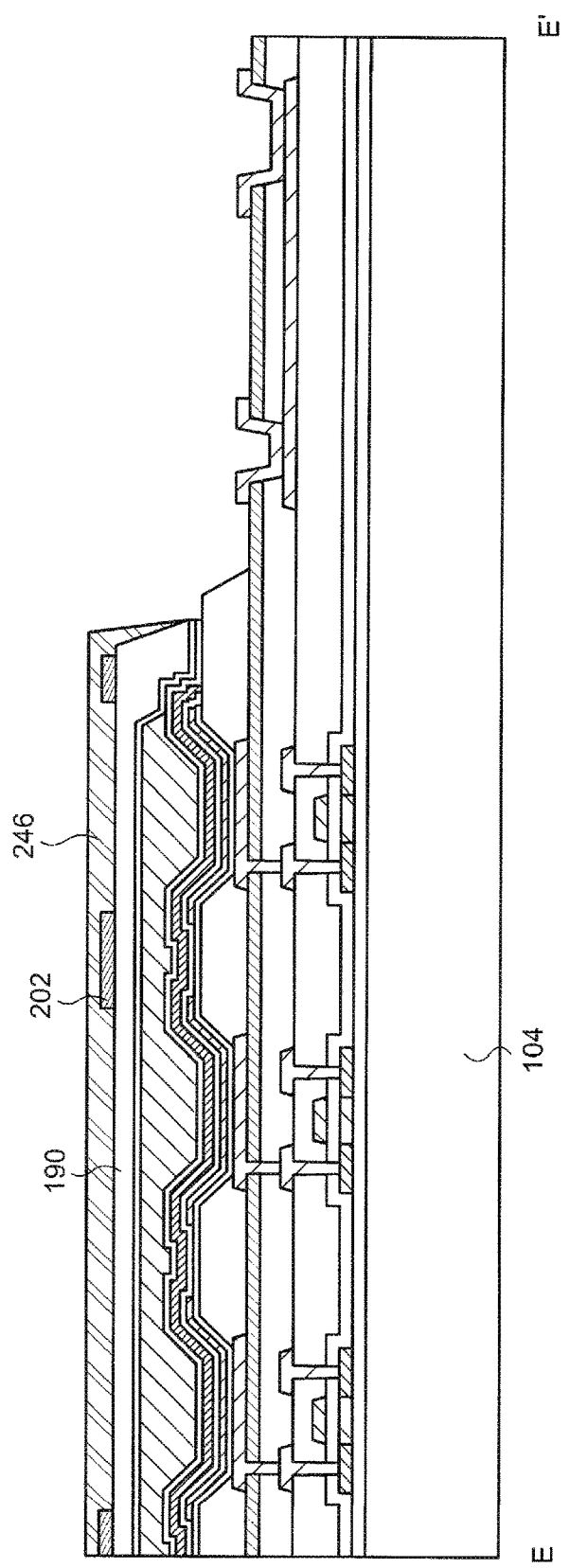

After that, the second layer 112 including the touch sensor 200 is prepared. Specifically, the first touch electrode 202 is prepared over the organic insulating film 190 (FIG. 20B). The first touch electrode 202 may include a metal (0-valent metal) as a main component exemplified by titanium, aluminum, molybdenum, tungsten, tantalum, chromium, copper, and an alloy thereof. A metal including the aforementioned metal or alloy is formed over substantially the entire surface of the substrate 104 with a CVD method or a sputtering method, a resist is formed thereover, and then etching is conducted (that is, a photolithography process is performed), thereby resulting in the first touch electrode 202 having a precise pattern as a mesh wiring.

Note that, when the first touch electrode 202 and the second touch electrode 204 exist in the same layer, the first touch electrode 202 and the second touch electrode 204 are prepared simultaneously. The first touch electrode 202 and the second touch electrode 204 may be formed with a conductive oxide having a light-transmitting property.

Next, the interlayer insulating film 246 is formed over the first touch electrode 202 (FIG. 20B). The interlayer insulating film 246 can be formed with the same material and method as those of the organic film 184. A difference in process from the leveling film 114 and the like is that a high temperature is not utilized when a baking treatment and the like is performed, for example. Since the functional layer 164 including an organic compound is already prepared before this process, a treatment below a temperature which causes decomposition of the organic compound is preferred. In the case where the first touch electrode 202 and the second touch electrode 204 exist in the same layer, the interlayer insulating film 246 is formed to cover these electrodes.

Figure 21:
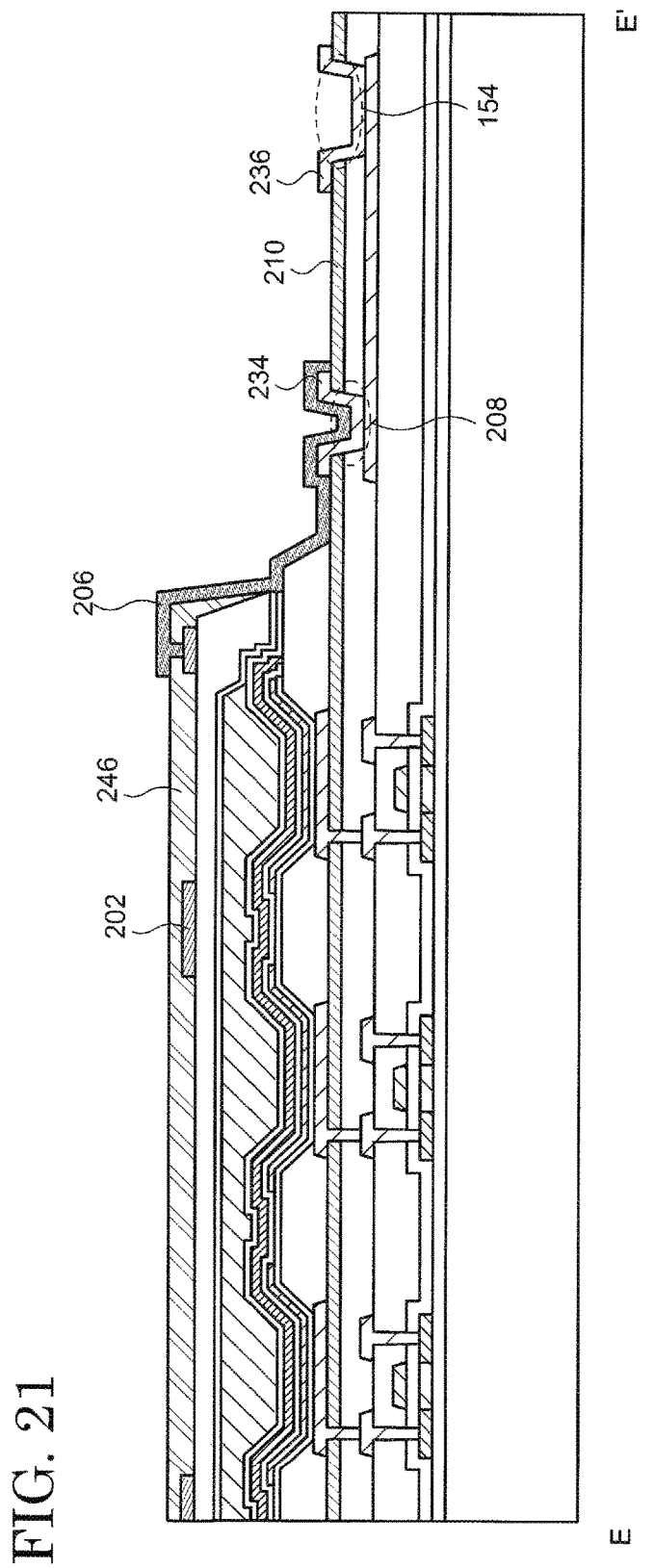
FIG. 21 is a schematic cross-sectional view explaining a manufacturing method of a display device according to an embodiment of the present invention.
Figure 22:
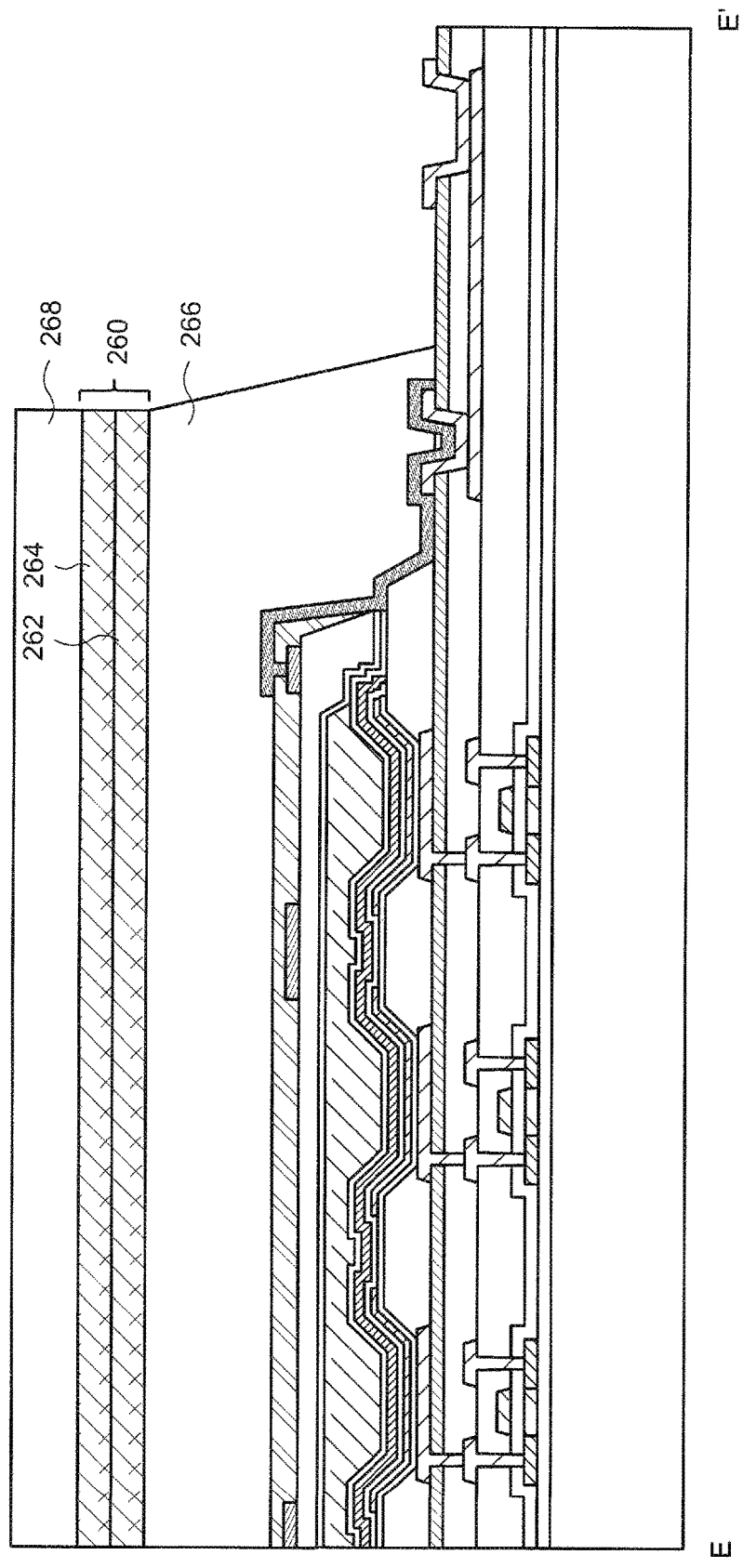
FIG. 22 is a schematic cross-sectional view explaining a manufacturing method of a display device according to an embodiment of the present invention.

After that, the opening is formed in the interlayer insulating film 246, and the first wiring 206 is formed in addition to the second touch electrode 204 so as to cover the opening. The opening can be formed when the interlayer insulating film 246 is prepared by using a photosensitive resin and the like, for example. The first wiring 206 is formed so as to cover the contact hole 208, by which the first touch electrode 202 and the first terminal wiring 210 are electrically connected (FIG. 21). The first wiring 206 and the second touch electrode 204 can be formed with the same method and material as the first touch electrode 202.

When the first touch electrode 202 and the second touch electrode 204 exist in the same layer, the openings 244 for electrically connecting the diamond electrodes 240 with each other are formed in the interlayer insulating film 246 in addition to the openings for connection between the first wiring 206 and the first touch electrode 202 and between the first wiring 206 and the second touch electrode 204. After that, the bridge wiring 248 and the first wiring 206 are simultaneously formed. In this case, the first wiring 206 may also be prepared with titanium, aluminum, molybdenum, tungsten, tantalum, chromium, copper, or an alloy thereof by using a CVD method or a sputtering method.

Through the processes described above, the second layer 112 is fabricated.

3. Other Layers

After that, the organic protection film 266, the circular polarizing plate 260, and the cover film 268 are formed. Next, the FPC 214 is connected in the opening 154 by using an anisotropic conductive film 252 and the like, thereby providing the display device 100 shown in FIG. 8. The organic protection film 266 may include a polymer material such as a polyester, an epoxy resin, and an acrylic resin and can be formed by applying a printing method, a lamination method, or the like. Similar to the organic protection film 266, the cover film 268 may also contain an organic material, and a polymer material such as a polyolefin and a polyimide may be applied in addition to the aforementioned polymer materials.

Although not illustrated, when flexibility is provided to the display device 100, adhesion between the substrate 104 and the base material may be decreased by irradiating the side of the substrate 104 with light such as a laser after forming the FPC 214, the circular polarizing plate 260, or the organic protection film 266, and then the substrate 104 may be peeled off at their interface by using physical force, for example.

As described in the present embodiment, the touch sensor 200 is structured by the plurality of first touch electrodes 202 and the plurality of second touch electrodes 204. The plurality of first touch electrodes 202 and the plurality of second touch electrodes 204 are each a metal wiring having a mesh form, and the metal wiring can be formed with a photolithography process. Hence, the first touch electrodes 202 and the second touch electrodes 204 having a precise layout can be prepared.

The aforementioned modes described as the embodiments of the present invention can be implemented by appropriately combining with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

In the specification, although the cases of the organic EL display device are exemplified, the embodiments can be applied to any kind of display devices of the flat panel type such as other self-emission type display devices, liquid crystal display devices, and electronic paper type display device having electrophoretic elements and the like. In addition, it is apparent that the size of the display device is not limited, and the embodiment can be applied to display devices having any size from medium to large.

It is properly understood that another effect different from that provided by the modes of the aforementioned embodiments is achieved by the present invention if the effect is obvious from the description in the specification or readily conceived by persons ordinarily skilled in the art.

What is claimed is:

1. A display device comprising:
a display region including a plurality of first sub-pixels configured to emit first light, a plurality of second sub-pixels configured to emit second light, and a plurality of third sub-pixels configured to emit third light;
a partition wall between two adjacent sub-pixels selected from the first sub-pixel, the second sub-pixel, and the third sub-pixel;
a sealing film over the first sub-pixels, the second sub-pixels, the third sub-pixels, and the partition wall;
a first touch electrode overlapping with the partition wall and arranged along the partition wall; and
a second touch electrode overlapping with the partition wall, arranged along the partition wall, and intersecting the first touch electrode,
wherein the first light, the second light, and the third light are different in color from one another,
the first touch electrode and the second touch electrode include a portion formed in the same layer,
the first touch electrode and the second touch electrode each have a plurality of openings,
among the number of the first sub-pixels, the number of the second sub-pixels, and the number of the third sub-pixels, one is different from the other two in a region overlapping with one of the openings,
a pixel is formed by at least two of the first sub-pixels, the second sub-pixels, and the third sub-pixels, and
$L_o$ is $(n+k/m)$ times $L_p$, where $L_o$ is a length of a side of the opening, $L_p$ is a length of the pixel, a vector of the $L_o$ is parallel to a vector of the $L_p$, n is an arbitrarily selected natural number, m is the number of columns formed in a direction perpendicular to the vector of the $L_p$ by the sub-pixels included in the pixel, and k is a natural number smaller than m.

2. The display device according to claim 1, further comprising a circular polarizing plate over the first touch electrode and the second touch electrode.

3. The display device according to claim 1,
wherein the sealing film has a stack of an inorganic film and an organic film, and
the display device further comprises a second organic film over and in contact with the sealing film.

4. The display device according to claim 1, further comprising:
a bridge wiring; and
an interlayer between the bridge wiring and the first touch electrode and between the bridge wiring and the second touch electrode,
wherein the second touch electrode has a plurality of electrodes, and
two adjacent electrodes are connected through the bridge wiring in a region where the first touch electrode intersects with the second touch electrode.

5. The display device according to claim 4,
wherein the first touch electrode and the second touch electrode are electrically connected to a first wiring and a second wiring, respectively, and
the first wiring and the second wiring are in the same layer as the bridge wiring.

6. The display device according to claim 5, further comprising a transistor which is electrically connected to at least one of the first sub-pixels, the second sub-pixels, and the third sub-pixels and includes a gate electrode and a source/drain electrode,
wherein the first wiring and the second wiring are electrically connected to a first terminal wiring and a second terminal wiring, respectively, outside the display region, and
the first terminal wiring and the second terminal wiring are in the same layer as one of the gate electrode, the source electrode, and the drain electrode.

7. The display device according to claim 6,
wherein a part of the first terminal wiring and a part of the second terminal wiring are exposed and electrically connected to a flexible printed circuit.

8. The display device according to claim 1,
wherein each of the first touch electrode and the second touch electrode comprises a plurality of square regions and a plurality of connection regions alternating with each other, and
an edge portion of each of the plurality of square regions has a portion which does not form the opening.

9. A display device comprising:
a display region including a plurality of first sub-pixels configured to emit first light, a plurality of second sub-pixels configured to emit second light, and a plurality of third sub-pixels configured to emit third light;
a partition wall between two adjacent sub-pixels selected from the first sub-pixel, the second sub-pixel, and the third sub-pixel; and
a sealing film over the first sub-pixels, the second sub-pixels, the third sub-pixels, and the partition wall;
a first touch electrode overlapping with the partition wall and arranged along the partition wall;
an interlayer insulating film over the first touch electrode; and a second touch electrode located over the interlayer insulating film, overlapping with the partition wall, arranged along the partition wall, and intersecting the first touch electrode, wherein the first light, the second light, and the third light are different in color from one another, the first touch electrode and the second touch electrode each have a plurality of openings, among the number of the first sub-pixels, the number of the second sub-pixels, and the number of the third sub-pixels, one is different from the other two in a region overlapping with one of the openings, a pixel is formed by at least two of the first sub-pixels, the second sub-pixels, and the third sub-pixels, and $L_o$ is (n+k/m) times $L_p$, where $L_o$ is a length of a side of the opening, $L_p$ is a length of the pixel, a vector of the $L_o$ is parallel to a vector of the $L_p$, m is an arbitrarily selected natural number, m is the number of columns formed in a direction perpendicular to the vector of the $L_p$ by the sub-pixels included in the pixel, and k is a natural number smaller than m.

10. The display device according to claim 9, further comprising a circular polarizing plate over the second touch electrode.

11. The display device according to claim 9, wherein the sealing film has a stack of an inorganic film and an organic film, and the display device further comprises a second organic film over and in contact with the sealing film.

12. The display device according to claim 9, wherein the first touch electrode and the second touch electrode are electrically connected to a first wiring and a second wiring, respectively, and the first wiring and the second wiring are in the same layer as the second touch electrode.

13. The display device according to claim 12, further comprising a transistor, the transistor being electrically connected to at least one of the first sub-pixels, the second sub-pixels, and the third sub-pixels and including a gate electrode and a source/drain electrode, wherein the first wiring and the second wiring are electrically connected to a first terminal wiring and a second terminal wiring, respectively, outside the display region, and the first terminal wiring and the second terminal wiring are in the same layer as one of the gate electrode, the source electrode, and the drain electrode.

14. The display device according to claim 13, wherein a part of the first terminal wiring and a part of the second terminal wiring are exposed and electrically connected to a flexible printed circuit.

15. The display device according to claim 9, wherein each of the first touch electrode and the second touch electrode comprises a plurality of square regions and a plurality of connection regions alternating with each other, and an edge portion of each of the plurality of square regions has a portion which does not form the opening.

\* \* \* \* \*